(12) United States Patent
Tseng et al.

(10) Patent No.: US 12,142,319 B2
(45) Date of Patent: Nov. 12, 2024

(54) HYBRID TYPE CONTENT ADDRESSABLE MEMORY FOR IMPLEMENTING IN-MEMORY-SEARCH AND OPERATION METHOD THEREOF

(71) Applicant: MACRONIX INTERNATIONAL CO., LTD., Hsinchu (TW)

(72) Inventors: Po-Hao Tseng, Taichung (TW); Tian-Cih Bo, Zhubei (TW); Feng-Min Lee, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 205 days.

(21) Appl. No.: 17/846,304

(22) Filed: Jun. 22, 2022

(65) Prior Publication Data
US 2023/0420047 A1   Dec. 28, 2023

(51) Int. Cl.
*G11C 15/04* (2006.01)

(52) U.S. Cl.
CPC ............ *G11C 15/04* (2013.01); *G11C 15/046* (2013.01)

(58) Field of Classification Search
CPC .............................. G11C 15/04; G11C 15/046
See application file for complete search history.

(56) References Cited

U.S. PATENT DOCUMENTS

| | | | | |
|---|---|---|---|---|
| 5,305,262 A * | 4/1994 | Yoneda | ................ | G11C 15/046 365/185.24 |
| 7,251,148 B2 | 7/2007 | Ma | | |
| 9,564,184 B2 | 2/2017 | Barth, Jr. | | |
| 11,410,727 B1 * | 8/2022 | Hoang | ................ | G11C 16/3404 |
| 2009/0190404 A1 * | 7/2009 | Roohparvar | ....... | G11C 16/0483 365/49.17 |
| 2020/0335146 A1 * | 10/2020 | Alrod | ..................... | G11C 16/26 |

* cited by examiner

*Primary Examiner* — Jay W. Radke
(74) *Attorney, Agent, or Firm* — McClure, Qualey & Rodack, LLP

(57) ABSTRACT

A hybrid type content addressable memory for implementing in-memory-search and an operation method thereof are provided. The CAM includes a plurality of CAM strings and at least one sense amplifier circuit. Each of the CAM strings includes a plurality of CAM cells. The CAM cells store a plurality of existing data. The sense amplifier circuit is connected to the CAM strings. A plurality of search data are inputted to the CAM strings. A plurality of cell matching results obtained from the CAM cells in each of the CAM strings are integrated via an AND operation to obtain a string matching result. The string matching results obtained from the CAM strings are integrated via an OR operation.

16 Claims, 25 Drawing Sheets

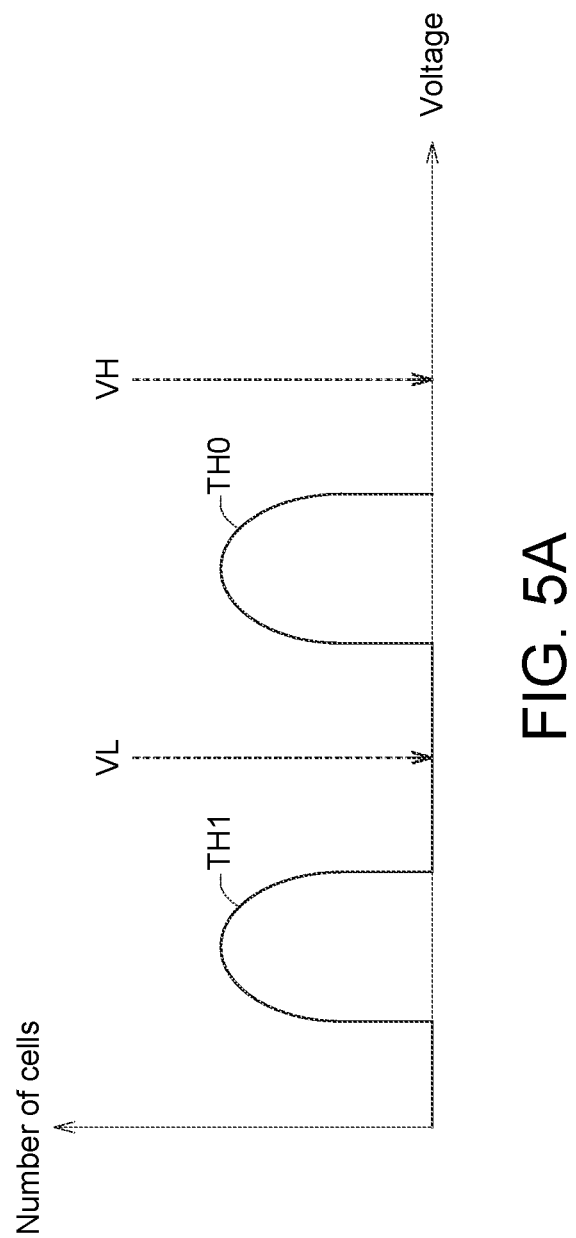

FIG. 8B

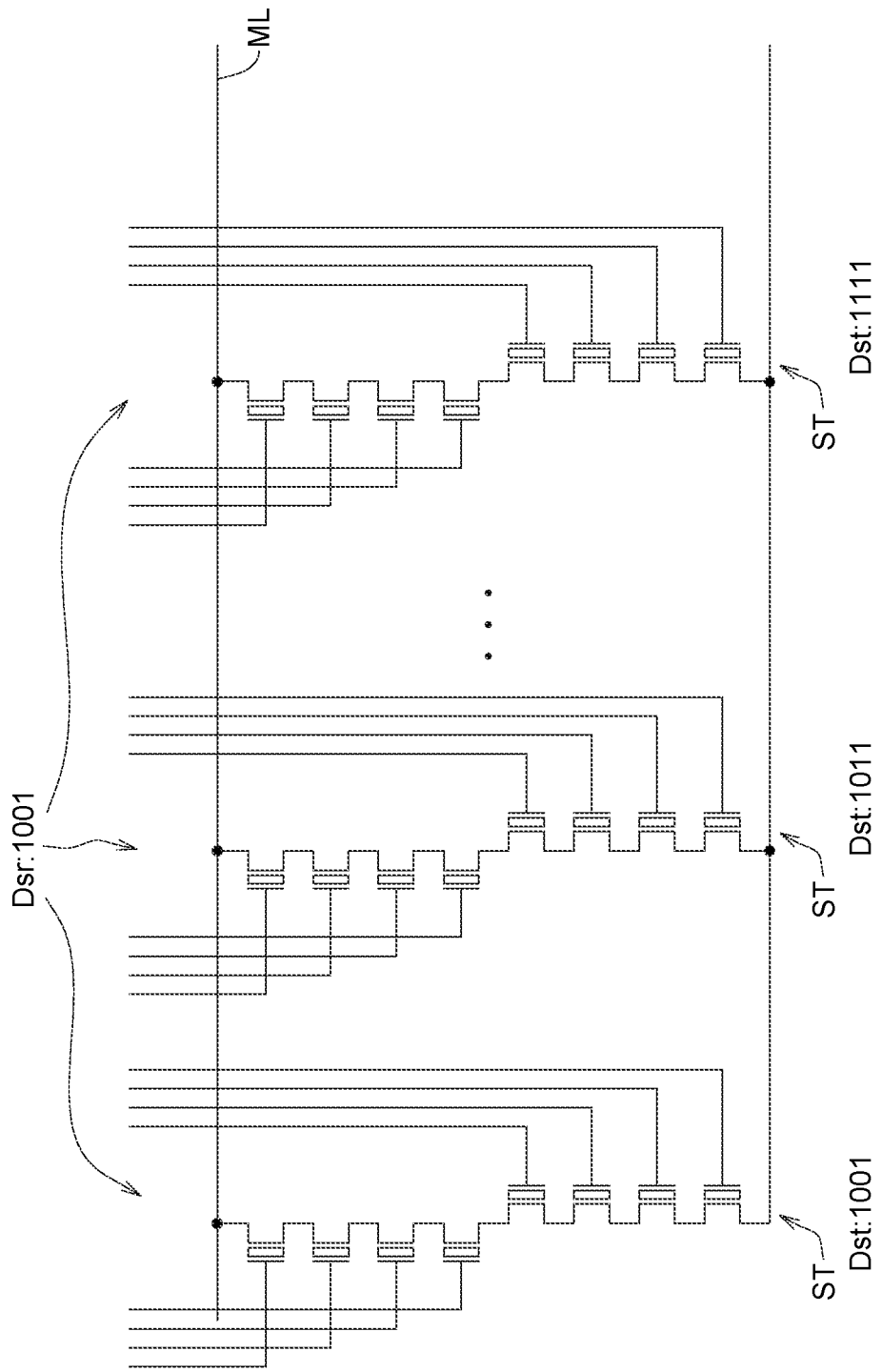

1

HYBRID TYPE CONTENT ADDRESSABLE MEMORY FOR IMPLEMENTING IN-MEMORY-SEARCH AND OPERATION METHOD THEREOF

TECHNICAL FIELD

The disclosure relates in general to a memory and an operation method thereof, and more particularly to a hybrid type content addressable memory for implementing in-memory-search and an operation method thereof.

BACKGROUND

According to the development of the artificial intelligence (AI) technology, in-memory-searching has been widely used in various electric devices. The content addressable memory used to perform the in-memory-searching operation has realized by a NOR-type architecture or a NAND-type architecture. The NOR-type CAM has high searching speed, but it dissipates large power consumption. The NAND-type CAM consumes the less power but it has low searching speed. The researchers are working on a new CAM that has the advantages of both of the NOR-type CAM and the NAND-type CAM.

SUMMARY

The disclosure is directed to a hybrid type content addressable memory for implementing in-memory-search and an operation method thereof are provided. The hybrid type CAM has the advantages of both of the NOR-type CAM and the NAND-type CAM, as such both of the searching speed and the power consumption are improved.

According to one embodiment, a content addressable memory (CAM) for implementing in-memory-search is provided. The CAM includes a plurality of CAM strings and at least one sense amplifier circuit. Each of the CAM strings includes a plurality of CAM cells. The CAM cells store a plurality of existing data. The sense amplifier circuit is connected to the CAM strings. A plurality of search data are inputted to the CAM strings. A plurality of cell matching results obtained from the CAM cells in each of the CAM strings are integrated via an AND operation to obtain a string matching result. The string matching results obtained from the CAM strings are integrated via an OR operation.

According to another embodiment, an operation method of a content addressable memory (CAM) for implementing in-memory-search is provided. The operation method for the CAM includes the following steps. A plurality of search data are inputted to a plurality of CAM strings each of which includes a plurality of CAM cells. The CAM cells store a plurality of existing data. A plurality of cell matching results obtained from the CAM cells in each of the CAM strings are integrated via an AND operation to obtain a string matching result. The string matching results obtained from the CAM strings are integrated via an OR operation.

BRIEF DESCRIPTION OF THE DRAWINGS

FIG. 5A illustrates the relationship among the high input voltage, the low input voltage, the high threshold voltage and the low threshold voltage according to one embodiment.

FIG. 8B shows the relationship between the existing data and the search data according to one embodiment.

FIG. 12A illustrates the operation of several CAM strings according to one embodiment.

Figure 1A:
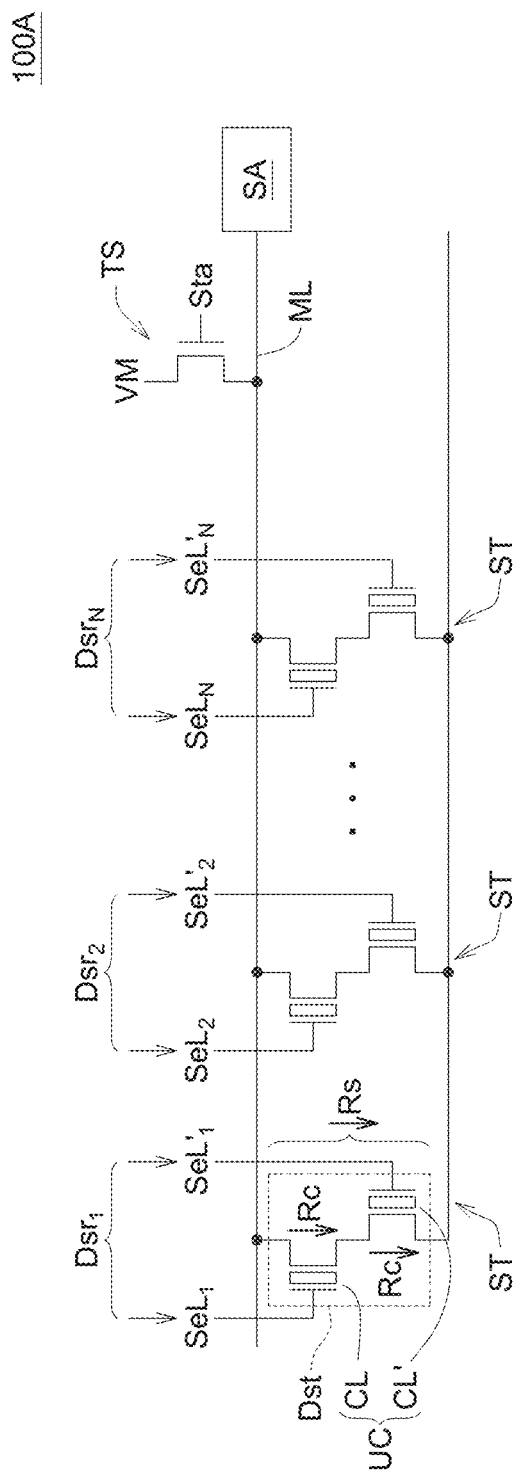
FIG. 1A shows a content addressable memory (CAM) for implementing in-memory-search according to one embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Please refer to FIG. 1A, which shows a content addressable memory (CAM) 100A for implementing in-memory-search according to one embodiment. The CAM 100A includes a plurality of CAM strings ST, a match line ML and a sense amplifier circuit SA. Each of the CAM strings ST includes two CAM cells CL, CL'. The CAM cells CL, CL' which are adjacent form a unit cell UC for storing one bit of an existing data Dst. For example, referring to the following table I, "the low threshold voltage TH1, the high threshold voltage TH0" set in the CAM cells CL, CL' represents "1" for the existing data Dst; "the high threshold voltage TH0, the low threshold voltage TH1" set in the CAM cells CL, CL' represents "0" for the existing data Dst; "the low threshold voltage TH1, the low threshold voltage TH1" set in the CAM cells CL, CL' represents "X" for the existing data Dst. "X" means "don't care."

TABLE I

| existing data Dst | CAM cells CL, CL' |
|---|---|
| 1 | TH1 TH0 |
| 0 | TH0 TH1 |
| X(Don't Care) | TH1 TH1 |

The match line ML is connected to the CAM strings ST. The sense amplifier circuit SA is connected to the match line ML. The transistor TS is turned on by an enable signal Sta to introduce a predetermined voltage VM. A plurality of search data $Dsr_1$ to $Dsr_N$ are inputted to the CAM strings ST. Two input lines $SeL_1$ to $SeL_N$, $SeL'_1$ to $SeL'_N$ are used to input one bit of the search data $Dsr_1$ to $Dsr_N$. For example, referring to the following table II, "the low input voltage VL, the high input voltage VH" applied to the input lines SeL, SeL' represents "1" for the search data Dsr; "the high input voltage VH, the low input voltage VL" applied to the input lines SeL, SeL' represents "0" for the search data Dsr; "the high input voltage VH, the high input voltage VH" applied to the input lines SeL, SeL' represents "X" for the search data Dsr. "X" means "wildcard."

TABLE II

| search data $Dsr_1$ to $Dsr_N$, input lines $SeL_1$ to $SeL_N$, $SeL'_1$ to $SeL'_N$ | 1 | 0 | X(wildcard) |
|---|---|---|---|
| | VL VH | VH VL | VH VH |

A plurality of cell matching results Rc obtained from the CAM cells CL, CL' in each of the CAM strings ST are integrated via an AND operation to obtain a string matching result Rs. For example, the CAM cells CL, CL' connected in series would be turned on or turned off depend on the relationship of the threshold voltage set in the CAM cells CL, CL' and the input voltage applied on the input lines $SeL_1$, $SeL'_1$. The potential of the match line ML will be dropped, only if all of the CAM cells CL, CL' in one of the CAM strings ST are turned on. That is to say, the cell matching results Rc obtained from the CAM cells CL, CL' in each of the CAM strings ST are integrated via the AND operation to obtain the string matching result Rs.

The string matching results Rs obtained from the CAM strings ST are integrated via an OR operation. For example, the potential of the match line ML will be dropped, when any of the CAM strings ST drops the potential. That is to say, the string matching results Rs are integrated via the OR operation.

Figure 1B:
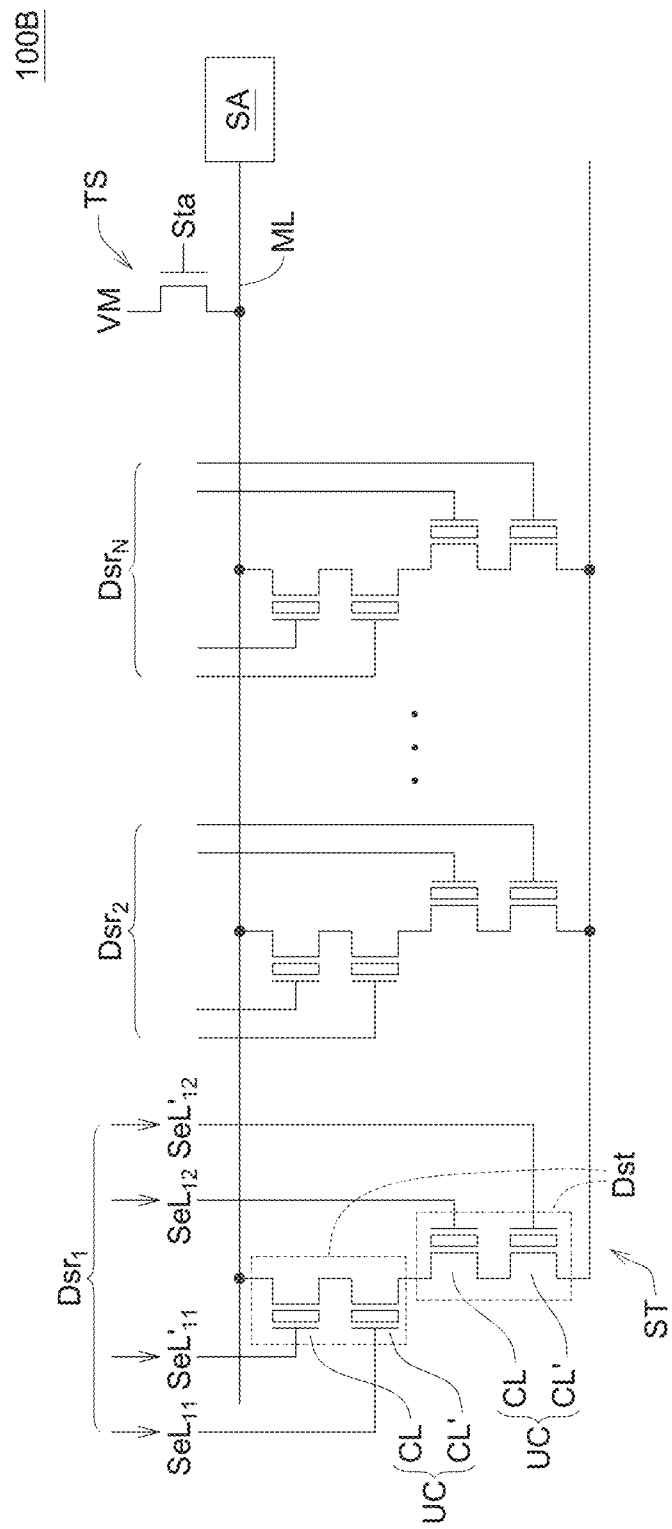
FIG. 1B shows a CAM for implementing in-memory-search according to another embodiment.

Please referring to FIG. 1B, which shows a CAM 100B for implementing in-memory-search according to another embodiment. The CAM string ST of the CAM 100B includes four CAM cells CL, CL' for storing two bits of the existing data Dst. Four input lines $SeL_{11}$, $SeL_{12}$, $SeL'_{11}$ and $SeL'_{12}$ connected to the CAM string ST are used to input two bits of the search data $Dsr_1$.

Figure 1C:
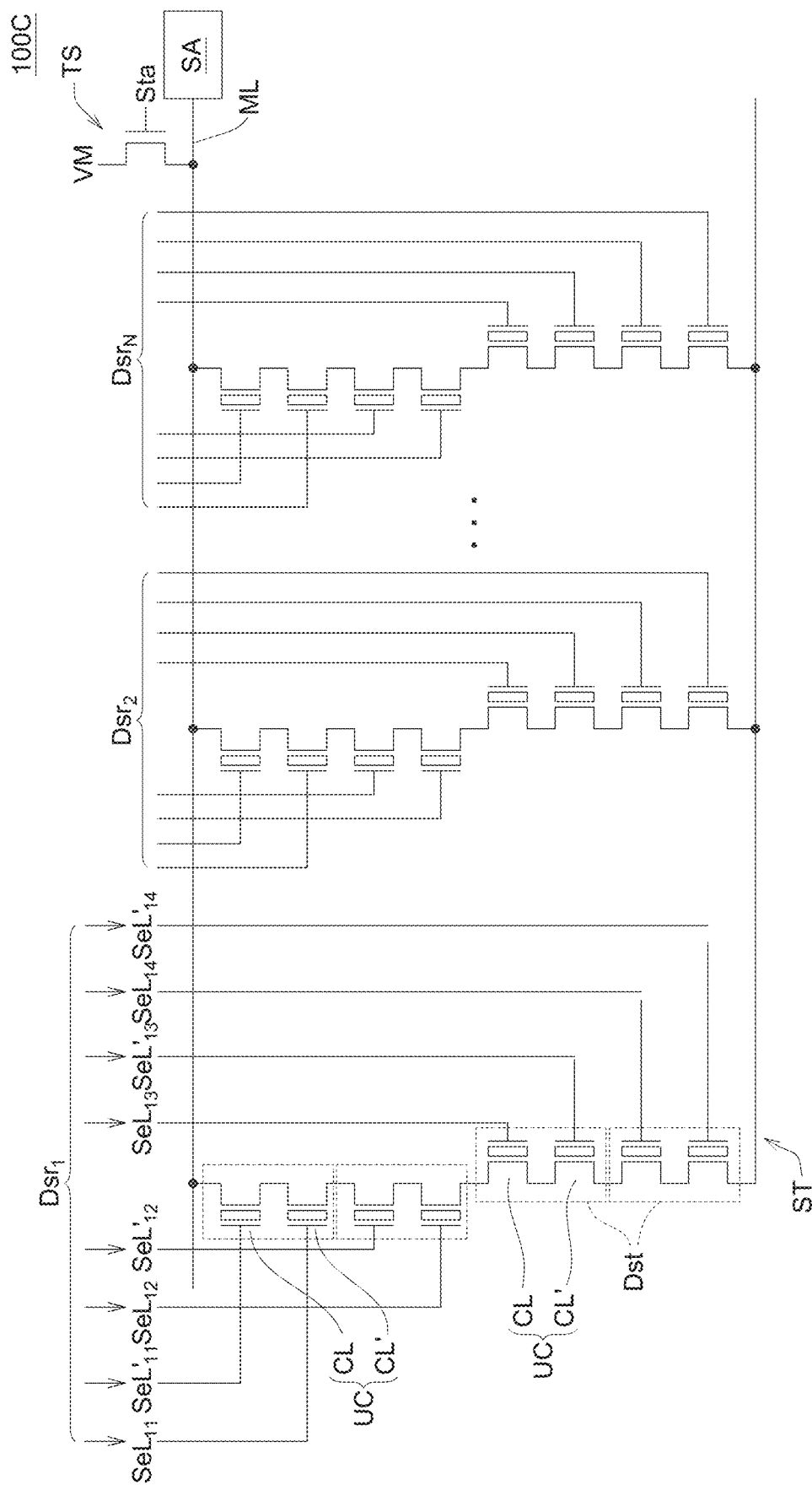
FIG. 1C shows a CAM for implementing in-memory-search according to another embodiment.

Please referring to FIG. 1C, which shows a CAM 100C for implementing in-memory-search according to another embodiment. The CAM string ST of the CAM 100C includes eight CAM cells CL, CL' for storing four bits of the existing data Dst. Eight input lines $SeL_{11}$, $SeL_{12}$, $SeL_{13}$, $SeL_{14}$, $SeL'_{11}$, $SeL'_{12}$, $SeL'_{13}$ and $SeL'_{14}$ connected to the CAM string ST are used to input four bits of the search data $Dsr_1$. The various CAMs described in the present disclosure can implement in-memory search according to the following flowchart.

Figure 2:
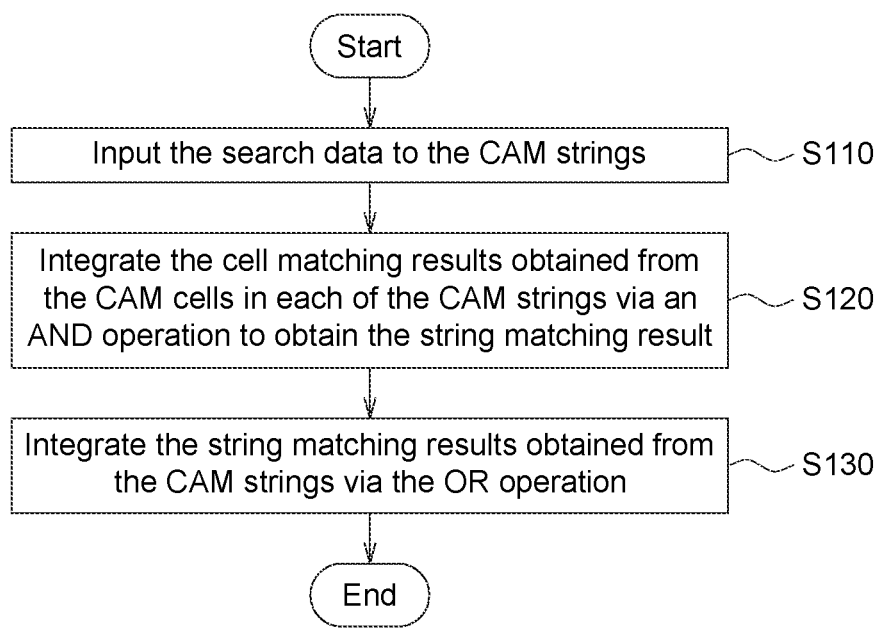
FIG. 2 shows a flowchart of an operation method of a CAM for implementing in-memory-search.

Please refer to FIG. 2, which shows a flowchart of an operation method of a CAM for implementing in-memory-search. In step S110, the search data Dsr are inputted to the CAM strings ST. Then, in step S120, the cell matching results Rc obtained from the CAM cells CL, CL' in each of the CAM strings ST are integrated via the AND operation to obtain the string matching result Rs. Next, in step S130, the string matching results Rs obtained from the CAM strings ST are integrated via the OR operation.

Figure 3A:
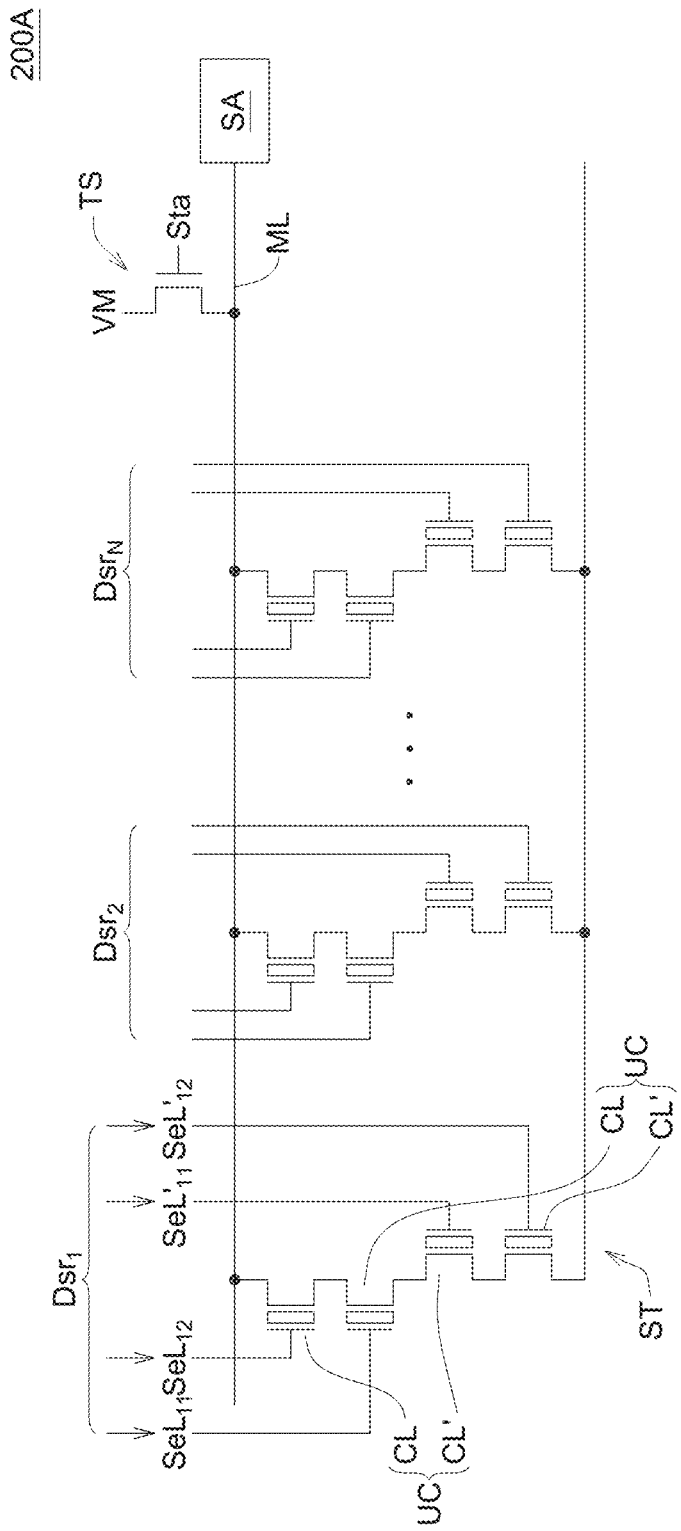
FIG. 3A shows a CAM for implementing in-memory-search according to another embodiment.

Please referring to FIG. 3A, which shows a CAM 200A for implementing in-memory-search according to another embodiment. The CAM string ST of the CAM 200A includes four CAM cells CL, CL' for storing two bits of the existing data Dst. Four input lines $SeL_{11}$, $SeL_{12}$, $SeL'_{11}$ and $SeL'_{12}$ connected to the CAM string ST are used to input two bits of the search data $Dsr_1$. In FIG. 3A, two of the CAM cells CL, CL' which are not adjacent form the unit cell UC for storing one bit of the existing data Dst (not shown in FIG. 3A).

Figure 3B:
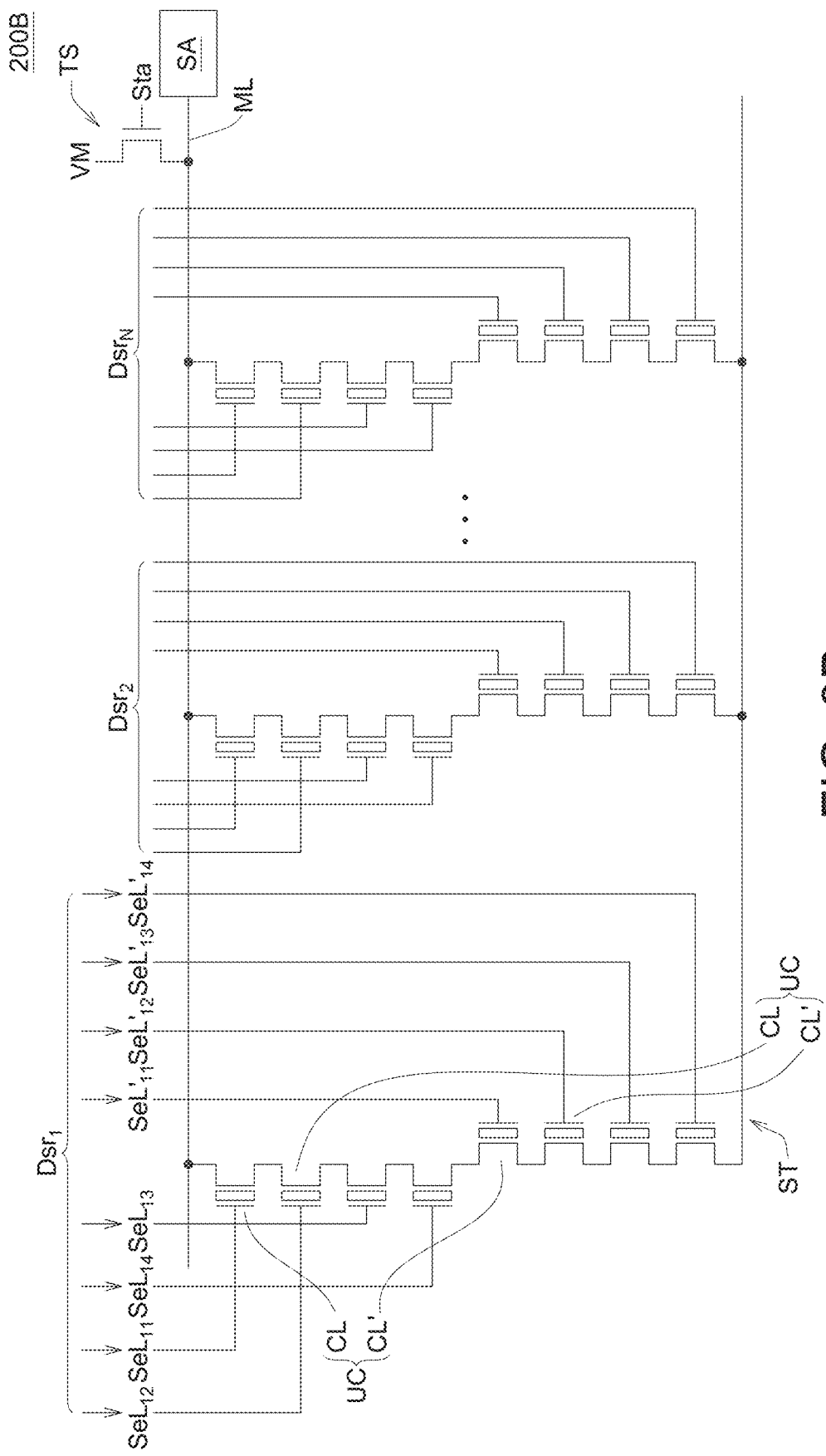
FIG. 3B shows a CAM for implementing in-memory-search according to another embodiment.

Please referring to FIG. 3B, which shows a CAM 200B for implementing in-memory-search according to another embodiment. The CAM string ST of the CAM 200B includes eight CAM cells CL, CL' for storing four bits of the existing data Dst. Eight input lines $SeL_{11}$, $SeL_{12}$, $SeL_{13}$, $SeL_{14}$, $SeL'_{11}$, $SeL'_{12}$, $SeL'_{13}$ and $SeL'_{14}$ connected to the CAM string ST are used to input four bits of the search data $Dsr_1$. In FIG. 3B, two of the CAM cells CL, CL' which are not adjacent form the unit cell UC for storing one bit of the existing data Dst (not shown in FIG. 3B).

Figure 4A:
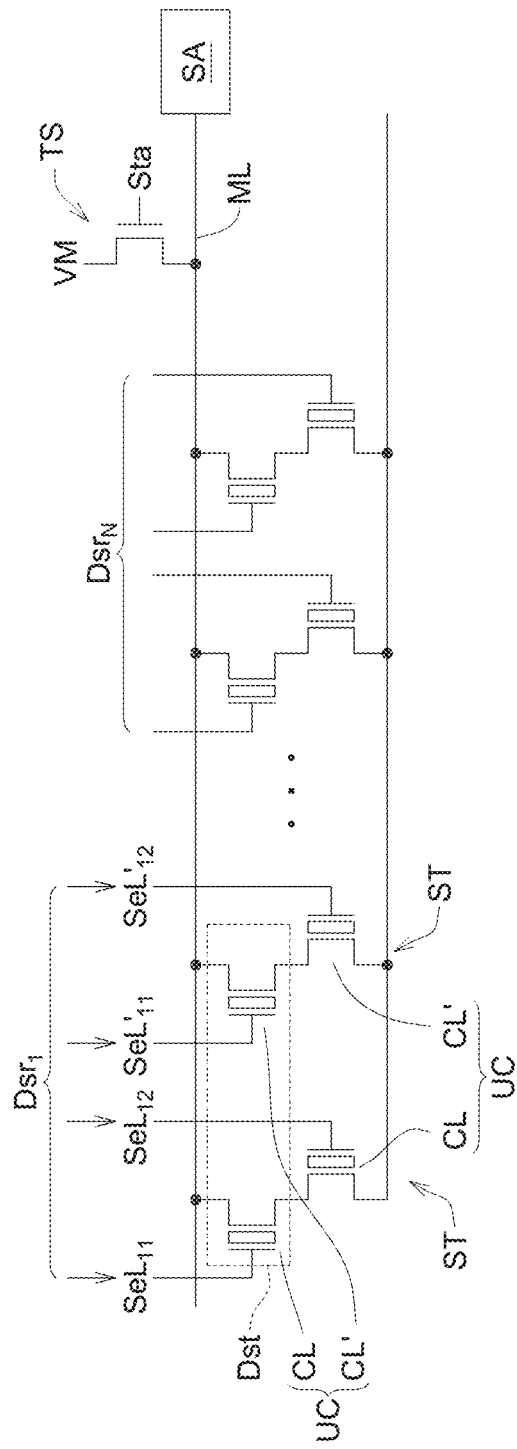
FIG. 4A shows a CAM for implementing in-memory-search according to one embodiment.

Please referring to FIG. 4A, which shows a CAM 300A for implementing in-memory-search according to one embodiment. Two CAM strings ST of the CAM 300A, which are adjacent, include four CAM cells CL, CL'. Four input lines $SeL_{11}$, $SeL_{12}$, $SeL'_{11}$ and $SeL'_{12}$ connected to the two CAM strings ST, which are adjacent, are used to input two bits of the search data $Dsr_1$. In FIG. 4A, two of the CAM cells CL, CL' which are located at two of the CAM strings ST, which are adjacent, form the unit cell UC for storing one bit of the existing data Dst.

Figure 4B:
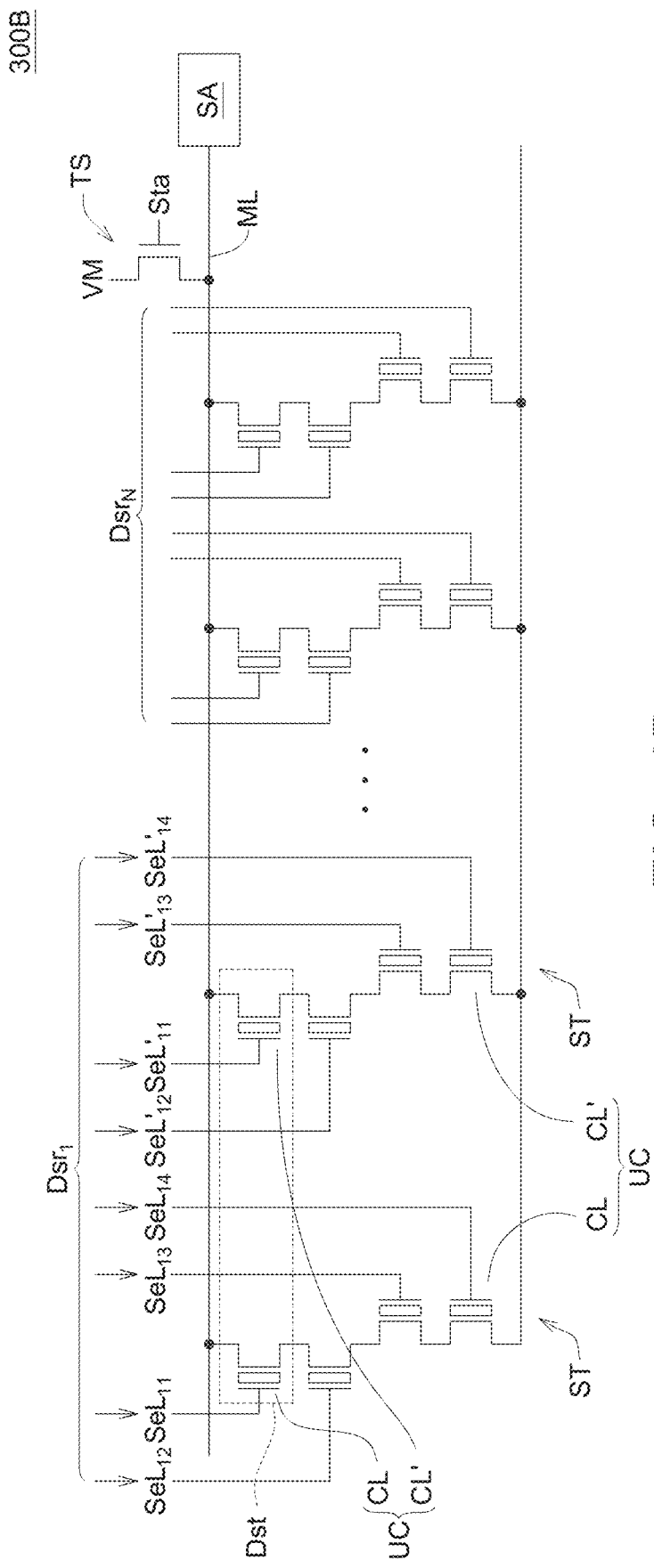
FIG. 4B shows a CAM for implementing in-memory-search according to another embodiment.

Please referring to FIG. 4B, which shows a CAM 300B for implementing in-memory-search according to another embodiment. Two CAM strings ST of the CAM 300B, which are adjacent, include eight CAM cells CL, CL'. Eight input lines $SeL_{11}$, $SeL_{12}$, $SeL_{13}$, $SeL_{14}$, $SeL'_{11}$, $SeL'_{12}$, $SeL'_{13}$ and $SeL'_{14}$ connected to the two CAM strings ST, which are adjacent, are used to input four bits of the search data $Dsr_1$. In FIG. 4B, two of the CAM cells CL, CL' which are located at two of the CAM strings ST, which are adjacent, form the unit cell UC for storing one bit of the existing data Dst.

Please refer to FIG. 5A, which illustrates the relationship among the high input voltage VH, the low input voltage VL, the high threshold voltage TH0 and the low threshold voltage TH1 according to one embodiment. In this embodiment, an exact matching is used. The high input voltage VH is higher than the high threshold voltage TH0 and the low threshold voltage TH1. The low input voltage VL is between the high threshold voltage TH0 and the low threshold voltage TH1. That is to say, the high input voltage VH applied to the input line SeL or SeL' will turn on the CAM cell CL or CL' set by the low threshold voltage TH1 or the high threshold voltage TH0. The low input voltage VL applied to the input line SeL or SeL' will turn on the CAM cell CL or CL' set by the low threshold voltage TH1, but will not turn on the CAM cell CL or CL' set by the high threshold voltage TH0.

Figure 5B:
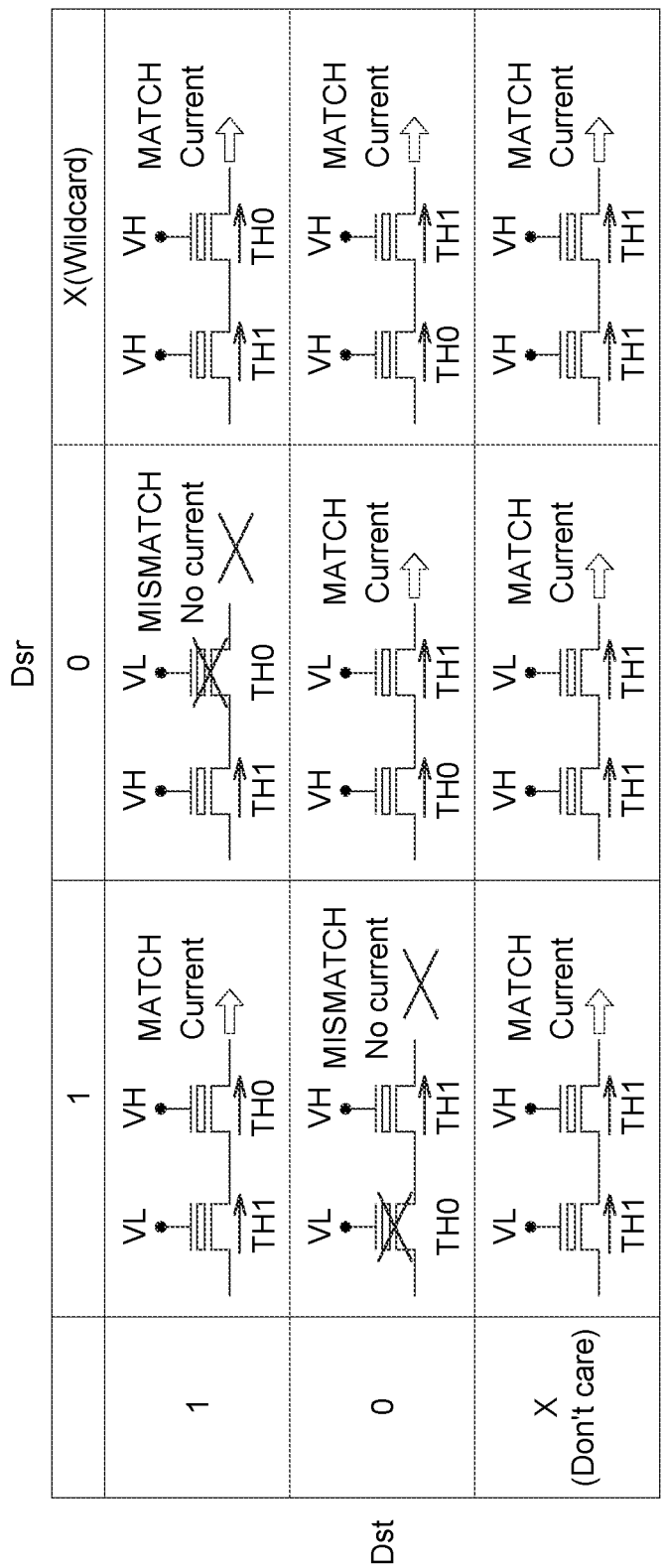
FIG. 5B shows the relationship between the existing data and the search data according to one embodiment.

Please refer to FIG. 5B and table III. FIG. 5B shows the relationship between the existing data Dst and the search data Dsr according to one embodiment. If the search data Dsr is "1" and the existing data Dst is "1", the low input voltage VL and the high input voltage VH applied to the input lines SeL, SeL' will respectively turn on the CAM cells CL, CL' set by the low threshold voltage TH1 and the high threshold voltage TH0, so the potential of the match line ML will be dropped. If the search data Dsr is "1" and the existing data Dst is "0", the low input voltage VL and the high input voltage VH applied to the input lines SeL, SeL' will not turn on the CAM cell CL set by the high threshold voltage TH0 and will turn on the CAM cell CL' set by the low threshold voltage TH1, so the potential of the match line ML will not be dropped. If the search data Dsr is "1" and the existing data Dst is "X", the low input voltage VL and the high input voltage VH applied to the input lines SeL, SeL' will turn on the CAM cells CL, CL' set by the low threshold voltage TH1 and the low threshold voltage TH1, so the potential of the match line ML will be dropped.

If the search data Dsr is "0" and the existing data Dst is "1", the high input voltage VH and the low input voltage VL applied to the input lines SeL, SeL' will turn on the CAM cell CL set by the low threshold voltage TH1 and will not turn on the CAM cell CL' set by the high threshold voltage TH0, so the potential of the match line ML will not be dropped. If the search data Dsr is "0" and the existing data Dst is "0", the high input voltage VH and the low input voltage VL applied to the input lines SeL, SeL' will respectively turn on the CAM cells CL, CL' set by the high threshold voltage TH0 and the low threshold voltage TH1, so the potential of the match line ML will be dropped. If the search data Dsr is "0" and the existing data Dst is "X", the high input voltage VH and the low input voltage VL applied to the input lines SeL, SeL' will turn on the CAM cells CL, CL' set by the low threshold voltage TH1 and the low threshold voltage TH1, so the potential of the match line ML will be dropped.

If the search data Dsr is "X" and the existing data Dst is "1", the high input voltage VH and the high input voltage VH applied to the input lines SeL, SeL' will respectively turn on the CAM cells CL, CL' set by the low threshold voltage TH1 and the high threshold voltage TH0, so the potential of the match line ML will be dropped. If the search data Dsr is "X" and the existing data Dst is "0", the high input voltage VH and the high input voltage VH applied to the input lines SeL, SeL' will respectively turn on the CAM cells CL, CL' set by the high threshold voltage TH0 and the low threshold voltage TH1, so the potential of the match line ML will be dropped. If the search data Dsr is "X" and the existing data Dst is "X", the high input voltage VH and the high input voltage VH applied to the input lines SeL, SeL' will respectively turn on the CAM cells CL, CL' set by the low threshold voltage TH1 and the low threshold voltage TH1, so the potential of the match line ML will be dropped.

TABLE III

| | | Search data Dsr | | |
|---|---|---|---|---|
| | | 1 (VL VH) | 0 (VH VL) | X (VH VH) |
| Existing data Dst | 1 (TH1 TH0) | Match | Mismatch | Match |
| | 0 (TH0 TH1) | Mismatch | Match | Match |
| | X (TH1 TH1) | Match | Match | Match |

Figure 6A:
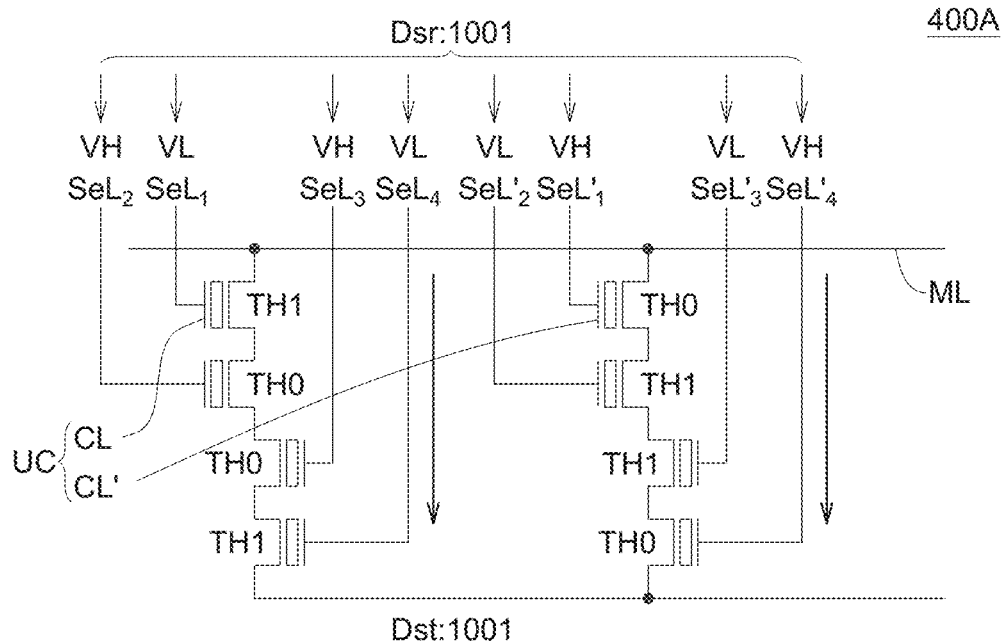
FIG. 6A illustrates one example of the operation method of a CAM.

Please refer to FIG. 6A, which illustrates one example of the operation method of a CAM 400A. When the existing data Dst is "1001", "the low threshold voltage TH1, the high threshold voltage TH0", "the high threshold voltage TH0, the low threshold voltage TH1", "the high threshold voltage TH0, the low threshold voltage TH1", "the low threshold voltage TH1, the high threshold voltage TH0" are respectively existing in four unit cells UC. When the search data Dsr is "1001", "the low input voltage VL, the high input voltage VH", "the high input voltage VH, the low input voltage VL", "the high input voltage VH, the low input voltage VL", "the low input voltage VL, the high input voltage VH" are respectively applied to the input lines $SeL_1$ and $SeL'_1$, $SeL_2$ and $SeL'_2$, $SeL_3$ and $SeL'_3$, and $SeL_4$ and $SeL'_4$. According to the table III, the existing data Dst which is "1001" and the search data Dsr which is "1001" are matched at all of the bits, so the potential of the match line ML will be greatly dropped.

Figure 6B:
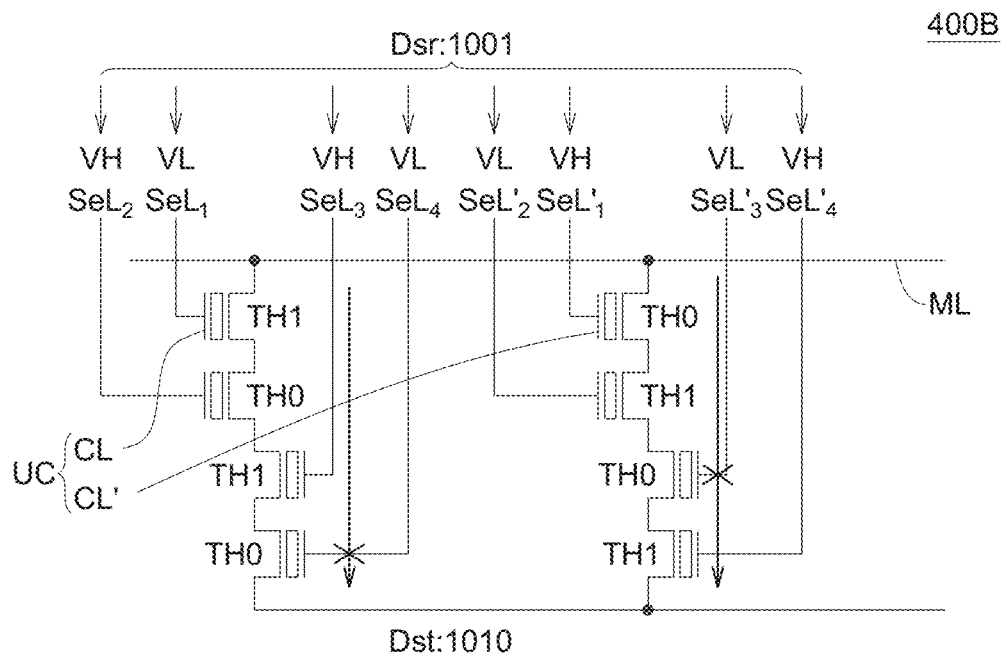
FIG. 6B illustrates another example of the operation method of a CAM.

Please refer to FIG. 6B, which illustrates another example of the operation method of a CAM 400B. When the existing data Dst is "1010", "the low threshold voltage TH1, the high threshold voltage TH0", "the high threshold voltage TH0, the low threshold voltage TH1", "the low threshold voltage TH1, the high threshold voltage TH0", "the high threshold voltage TH0, the low threshold voltage TH1" are respectively existing in four unit cells UC. When the search data Dsr is "1001", "the low input voltage VL, the high input voltage VH", "the high input voltage VH, the low input voltage VL", "the high input voltage VH, the low input voltage VL", "the low input voltage VL, the high input voltage VH" are respectively applied to the input lines $SeL_1$ and $SeL'_1$, $SeL_2$ and $SeL'_2$, $SeL_3$ and $SeL'_3$, and $SeL_4$ and $SeL'_4$. According to the table III, the existing data Dst which is "1010" and the search data Dsr which is "1001" are not matched, so the potential of the match line ML will not be dropped.

Figure 6C:
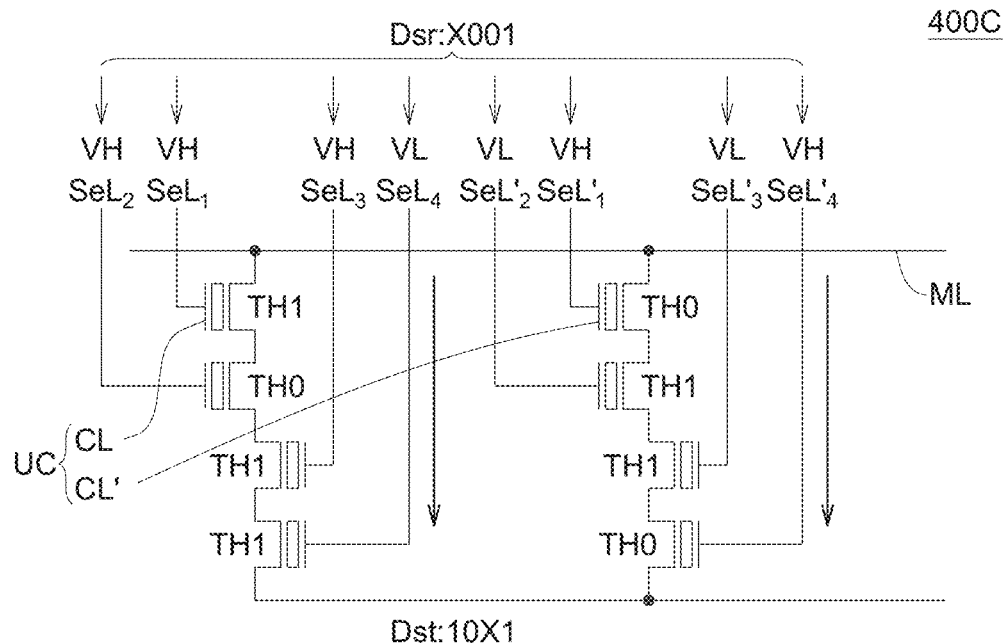
FIG. 6C illustrates another example of the operation method of a CAM.

Please refer to FIG. 6C, which illustrates another example of the operation method of a CAM 400C. When the existing data Dst is "10X1", "the low threshold voltage TH1, the high threshold voltage TH0", "the high threshold voltage TH0, the low threshold voltage TH1", "the low threshold voltage TH1, TH1", "the low threshold voltage TH1, the high threshold voltage TH0" are respectively existing in four unit cells UC. When the search data Dsr is "X001", "the high input voltage VH, the high input voltage VH", "the high input voltage VH, the low input voltage VL", "the high input voltage VH, the low input voltage VL", "the low input voltage VL, the high input voltage VH" are respectively applied to the input lines $SeL_1$ and $SeL'_1$, $SeL_2$ and $SeL'_2$, $SeL_3$ and $SeL'_3$, and $SeL_4$ and $SeL'_4$. According to the table III, the existing data Dst which is "10X1" and the search data Dsr which is "X001" are matched at all of the bits, so the potential of the match line ML will be greatly dropped.

Figure 6D:
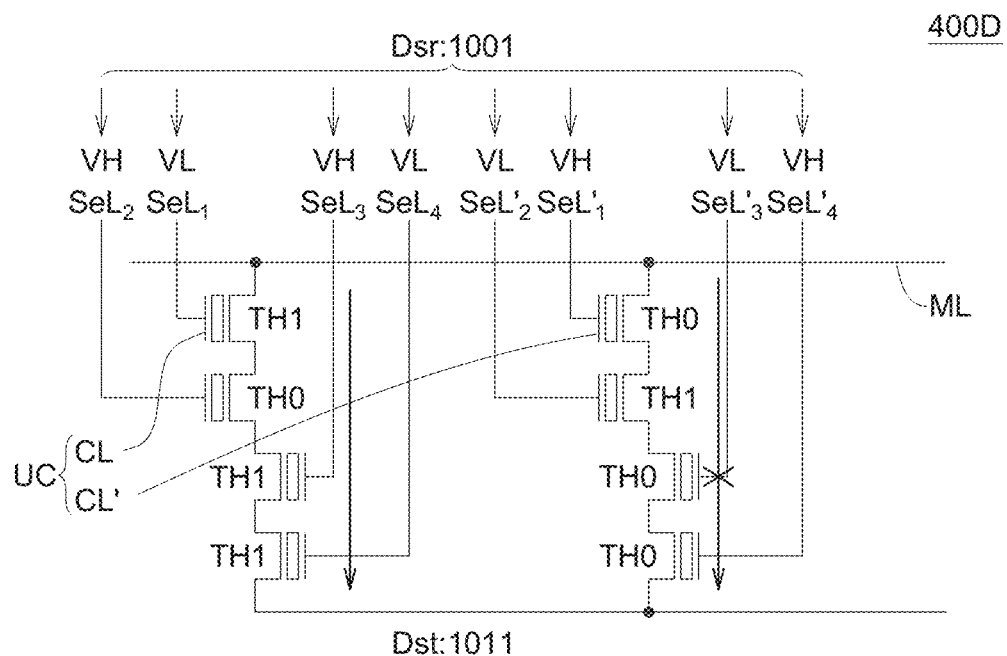
FIG. 6D illustrates another example of the operation method of a CAM.

Please refer to FIG. 6D, which illustrates another example of the operation method of a CAM 400D. When the existing data Dst is "1011", "the low threshold voltage TH1, the high threshold voltage TH0", "the high threshold voltage TH0, the low threshold voltage TH1", "the low threshold voltage TH1, TH0", "the low threshold voltage TH1, the high threshold voltage TH0" are respectively existing in four unit cells UC. When the search data Dsr is "1001", "the low input voltage VL, the high input voltage VH", "the high input voltage VH, the low input voltage VL", "the high input voltage VH, the low input voltage VL", "the low input voltage VL, the high input voltage VH" are respectively applied to the input lines $SeL_1$ and $SeL'_1$, $SeL_2$ and $SeL'_2$, $SeL_3$ and $SeL'_3$, and $SeL_4$ and $SeL'_4$. According to the table III, the existing data Dst which is "1011" and the search data Dsr which is "1001" are not matched, so the potential of the match line ML will not be greatly dropped.

Figure 7:
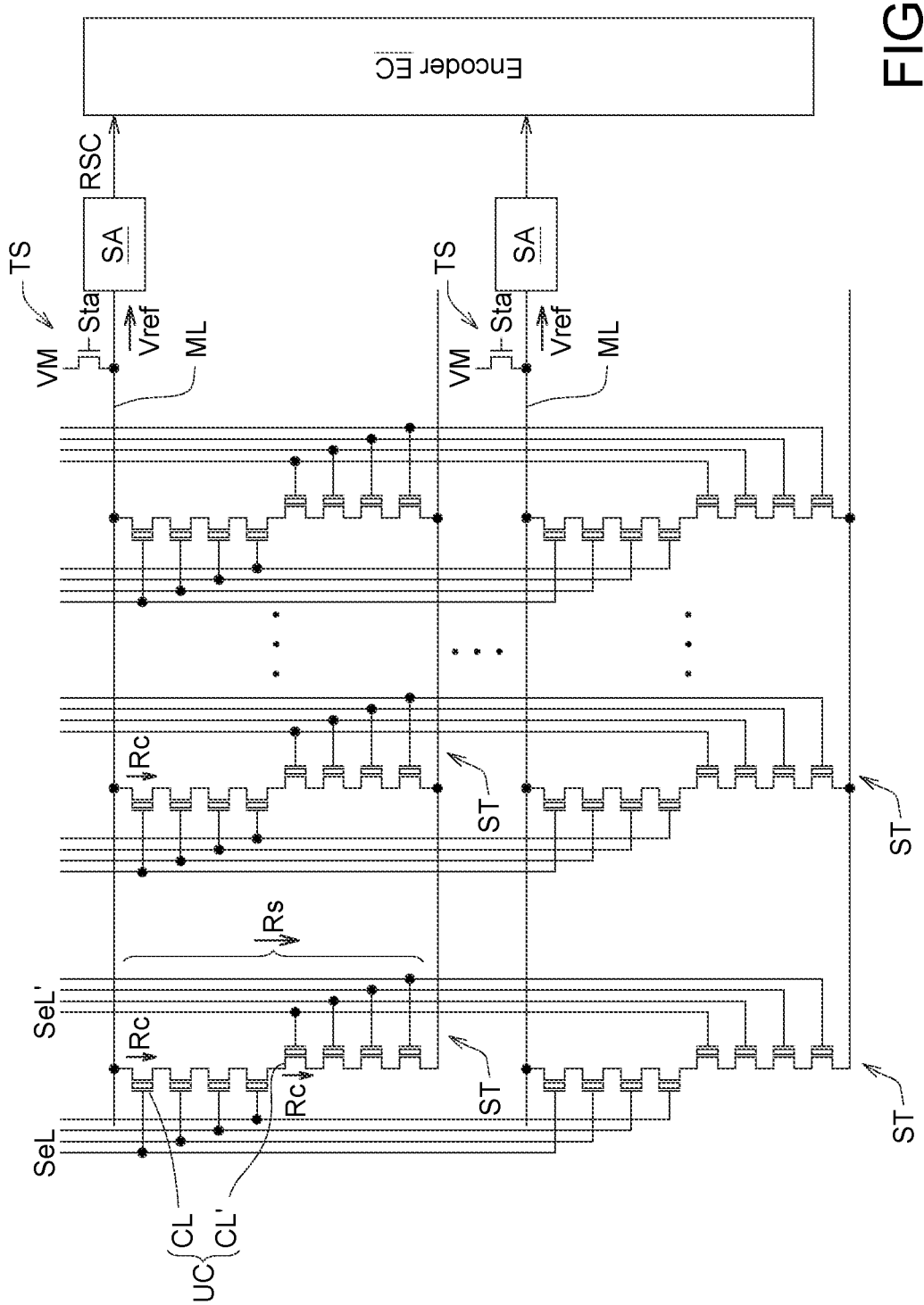
FIG. 7 shows another CAM with array architecture according to one embodiment.

Please refer to FIG. 7, which shows another CAM 500 with array architecture according to one embodiment. The CAM 500 includes a plurality of CAM strings ST, a plurality of sense amplifier circuits SA and a plurality of match lines ML. Each of the match lines ML is connected to some of the CAM strings ST, and each of the sense amplifier circuits SA is connected to one of the match lines ML. In one of the CAM strings ST, the CAM cells CL, CL' are connected in series, thereby a plurality of cell matching results Rc obtained from the CAM cells CL, CL' in each of the CAM strings ST are integrated via the AND operation to obtain the string matching result Rs. For example, the CAM cells CL, CL' connected in series would be turned on or turned off depend on the relationship of the threshold voltage set in the CAM cells CL, CL' and the input voltage applied on the input lines SeL, SeL'. The potential of the match line ML will be dropped, only if all of the CAM cells CL, CL' in one of the CAM strings ST are turned on. That is to say, the cell matching results Rc obtained from the CAM cells CL, CL' in each of the CAM strings ST are integrated via the AND operation to obtain the string matching result Rs.

The CAM strings ST are connected to one of the match lines ML, thereby the string matching results Rs obtained from the CAM strings ST are integrated via the OR operation. For example, the potential of the match line ML will be dropped, when any of the CAM strings ST drops the potential. That is to say, the string matching results Rs are integrated via the OR operation. The sense amplifier circuit SA compares the potential of the matching line ML with a reference potential Vref to output a comparison result RSC. After receiving these comparison results RSC, the encoder EC sorts the matching degree of these CAM strings ST.

Figure 8A:
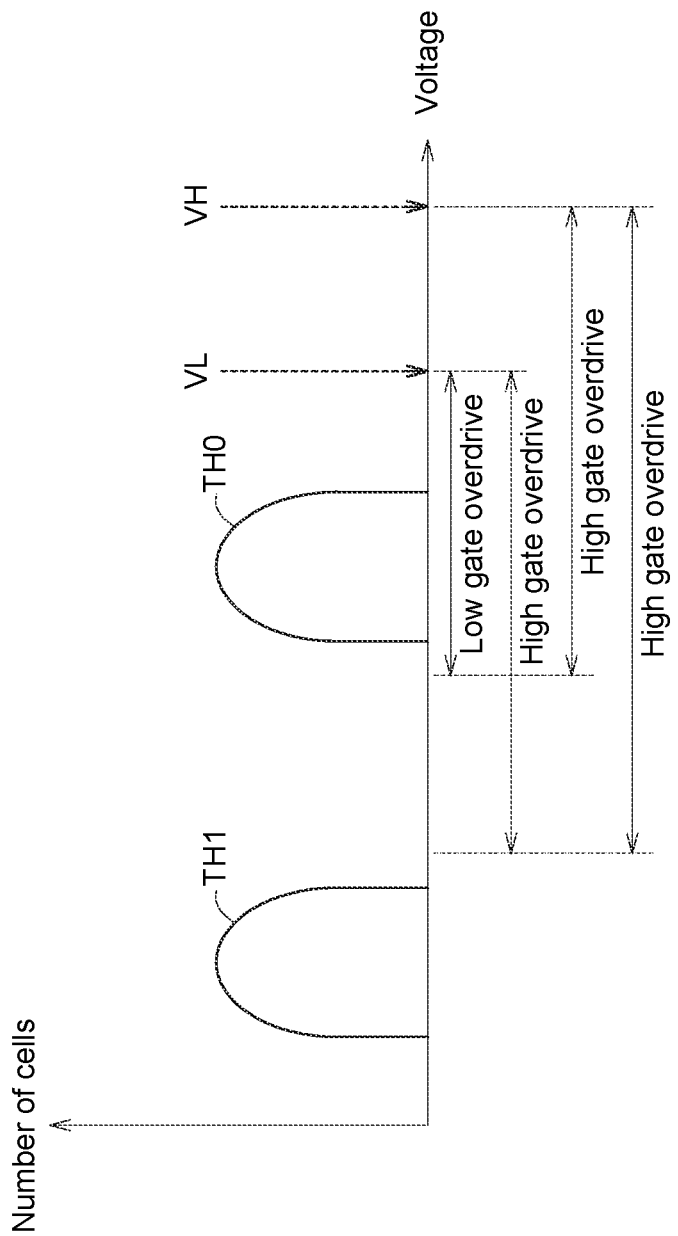
FIG. 8A illustrates the relationship among the high input voltage, the low input voltage, the high threshold voltage and the low threshold voltage according to another embodiment.

Please refer to FIG. 8A, which illustrates the relationship among the high input voltage VH, the low input voltage VL, the high threshold voltage TH0 and the low threshold voltage TH1 according to another embodiment. In this embodiment, an approximate matching is used. The low input voltage VL is higher than the high threshold voltage TH0 and the low threshold voltage TH1. The high input voltage VH is higher than the low input voltage VL, the high threshold voltage TH0 and the low threshold voltage TH1. That is to say, the high input voltage VH applied to the input line SeL or SeL' will turn on the CAM cell CL or CL' set by the low threshold voltage TH1 or the high threshold voltage TH0 with high gate overdrive. The low input voltage VL applied to the input line SeL or SeL' will turn on the CAM cell CL or CL' set by the high threshold voltage TH0 with low gate overdrive. The low input voltage VL applied to the input line SeL or SeL' will turn on the CAM cell CL or CL' set by the low threshold voltage TH1 with high gate overdrive.

Figure 8B:
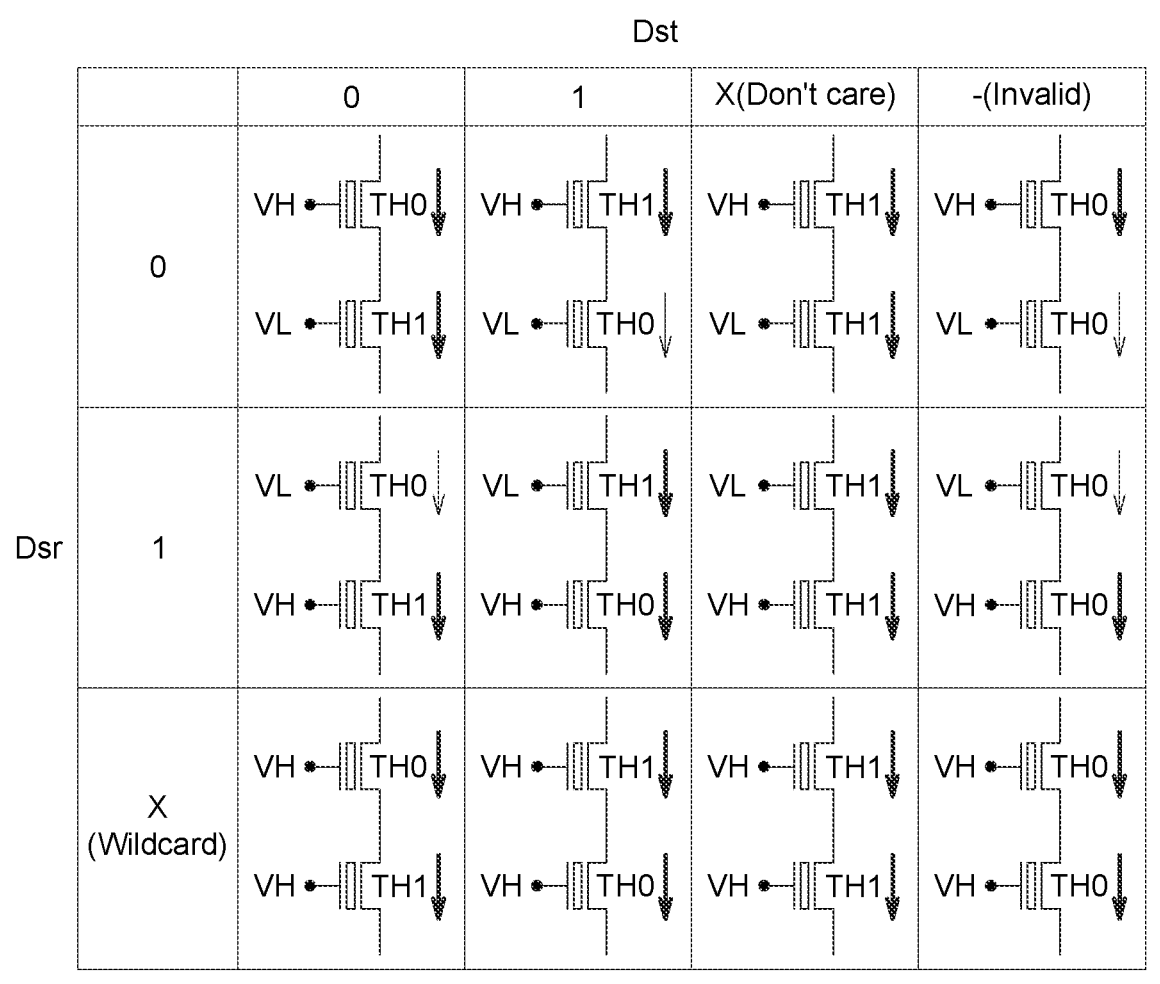

Please refer to FIG. 8B and the following table IV. FIG. 8B shows the relationship between the existing data Dst and the search data Dsr according to one embodiment. If the search data Dsr is "0" and the existing data Dst is "0", the high input voltage VH and the low input voltage VL applied to the input lines SeL, SeL' will respectively turn on the CAM cells CL, CL' set by the high threshold voltage TH0 and the low threshold voltage TH1 with high gate overdrive both, so the potential of the match line ML will be greatly dropped. If the search data Dsr is "0" and the existing data Dst is "1", the high input voltage VH and the low input voltage VL applied to the input lines SeL, SeL' will respectively turn on the CAM cells CL, CL' set by the low threshold voltage TH1 and the high threshold voltage TH0 with high gate overdrive and low gate overdrive, so the potential of the match line ML will be slightly dropped. If the search data Dsr is "0" and the existing data Dst is "X", the high input voltage VH and the low input voltage VL applied to the input lines SeL, SeL' will respectively turn on the CAM cells CL, CL' set by the low threshold voltage TH1 and the low threshold voltage TH1 with high gate overdrive both, so the potential of the match line ML will be greatly dropped. If the search data Dsr is "0" and the existing data Dst is "–" (invalid), the high input voltage VH and the low input voltage VL applied to the input lines SeL, SeL' will respectively turn on the CAM cells CL, CL' set by the high threshold voltage TH0 and the high threshold voltage TH0 with high gate overdrive and low gate overdrive, so the potential of the match line ML will be slightly dropped.

If the search data Dsr is "1" and the existing data Dst is "0", the low input voltage VL and the high input voltage VH applied to the input lines SeL, SeL' will respectively turn on the CAM cells CL, CL' set by the high threshold voltage TH0 and the low threshold voltage TH1 with low gate overdrive and high gate overdrive, so the potential of the match line ML will be slightly dropped. If the search data Dsr is "1" and the existing data Dst is "1", the low input voltage VL and the high input voltage VH applied to the input lines SeL, SeL' will respectively turn on the CAM cells CL, CL' set by the low threshold voltage TH1 and the high threshold voltage TH0 with high gate overdrive both, so the potential of the match line ML will be greatly dropped. If the search data Dsr is "1" and the existing data Dst is "X", the low input voltage VL and the high input voltage VH applied to the input lines SeL, SeL' will respectively turn on the CAM cells CL, CL' set by the low threshold voltage TH1 and the low threshold voltage TH1 with high gate overdrive both, so the potential of the match line ML will be greatly dropped. If the search data Dsr is "1" and the existing data Dst is "–" (invalid), the low input voltage VL and the high input voltage VH applied to the input lines SeL, SeL' will respectively turn on the CAM cells CL, CL' set by the high threshold voltage TH0 and the high threshold voltage TH0 with low gate overdrive and high gate overdrive, so the potential of the match line ML will be slightly dropped.

If the search data Dsr is "X" and the existing data Dst is "0", the high input voltage VH and the high input voltage VH applied to the input lines SeL, SeL' will respectively turn on the CAM cells CL, CL' set by the high threshold voltage TH0 and the low threshold voltage TH1 with high gate overdrive both, so the potential of the match line ML will be greatly dropped. If the search data Dsr is "X" and the existing data Dst is "1", the high input voltage VH and the high input voltage VH applied to the input lines SeL, SeL' will respectively turn on the CAM cells CL, CL' set by the low threshold voltage TH1 and the high threshold voltage TH0 with high gate overdrive both, so the potential of the match line ML will be greatly dropped. If the search data Dsr is "X" and the existing data Dst is "X", the high input voltage VH and the high input voltage VH applied to the input lines SeL, SeL' will respectively turn on the CAM cells CL, CL' set by the low threshold voltage TH1 and the low threshold voltage TH1 with high gate overdrive both, so the potential of the match line ML will be greatly dropped. If the search data Dsr is "X" and the existing data Dst is "–" (invalid), the high input voltage VH and the high input voltage VH applied to the input lines SeL, SeL' will respectively turn on the CAM cells CL, CL' set by the high threshold voltage TH0 and the high threshold voltage TH0 with high gate overdrive both, so the potential of the match line ML will be greatly dropped.

TABLE IV

|  |  | Existing data Dst | | | |
|---|---|---|---|---|---|
|  |  | 0 (TH0 TH1) | 1 (TH1 TH0) | X (TH1 TH1) | — (TH0 TH0) |
| Search data Dsr | 0 (VH VL) | High current | Low current | High current | Low current |
|  | 1 (VL VH) | Low current | High current | High current | Low current |
|  | X (VH1 VH) | High current | High current | High current | High current |

Figure 9A:
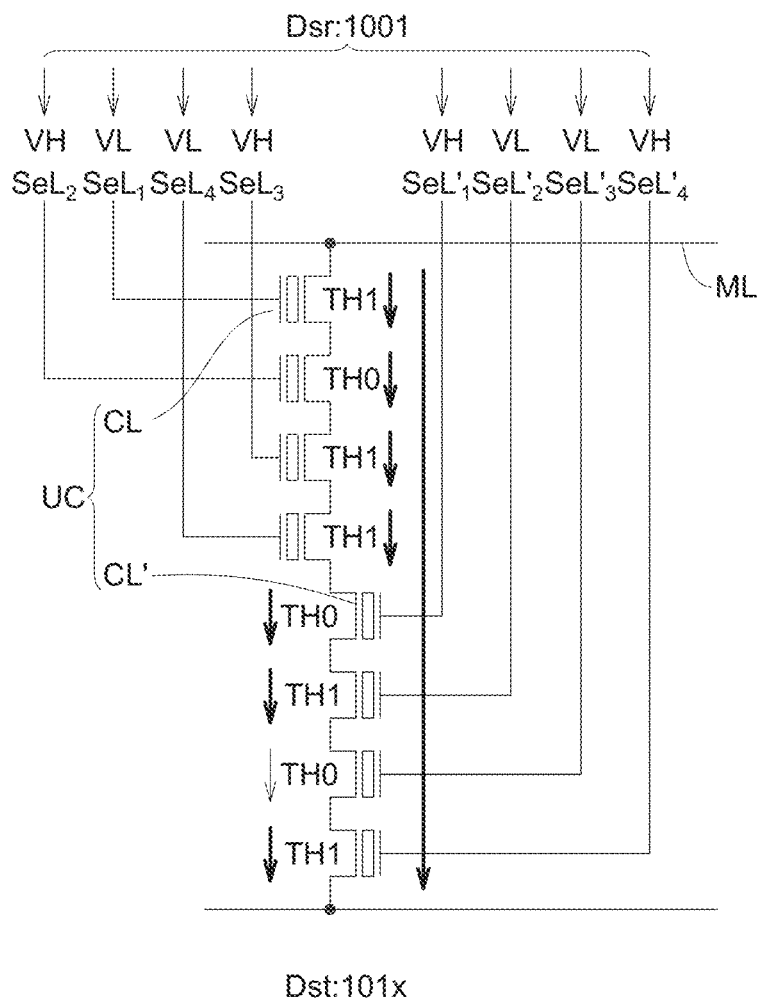
FIG. 9A illustrates one example of the operation method of a CAM.

Please refer to FIG. 9A, which illustrates one example of the operation method of a CAM 600A. When the existing data Dst is "101X", "the low threshold voltage TH1, the high threshold voltage TH0", "the high threshold voltage TH0, the low threshold voltage TH1", "the low threshold voltage TH1, the high threshold voltage TH0", "the low threshold voltage TH1, the low threshold voltage TH1" are respectively existing in four unit cells UC. When the search data Dsr is "1001", "the low input voltage VL, the high input voltage VH", "the high input voltage VH, the low input voltage VL", "the high input voltage VH, the low input voltage VL", "the low input voltage VL, the high input voltage VH" are respectively applied to the input lines $SeL_1$ and $SeL'_1$, $SeL_2$ and $SeL'_2$, $SeL_3$ and $SeL'_3$, and $SeL_4$ and $SeL'_4$. According to the table IV, the existing data Dst which is "101X" and the search data Dsr which is "1001" are matched at three of the bits, so the potential of the match line ML will be greatly dropped.

Figure 9B:
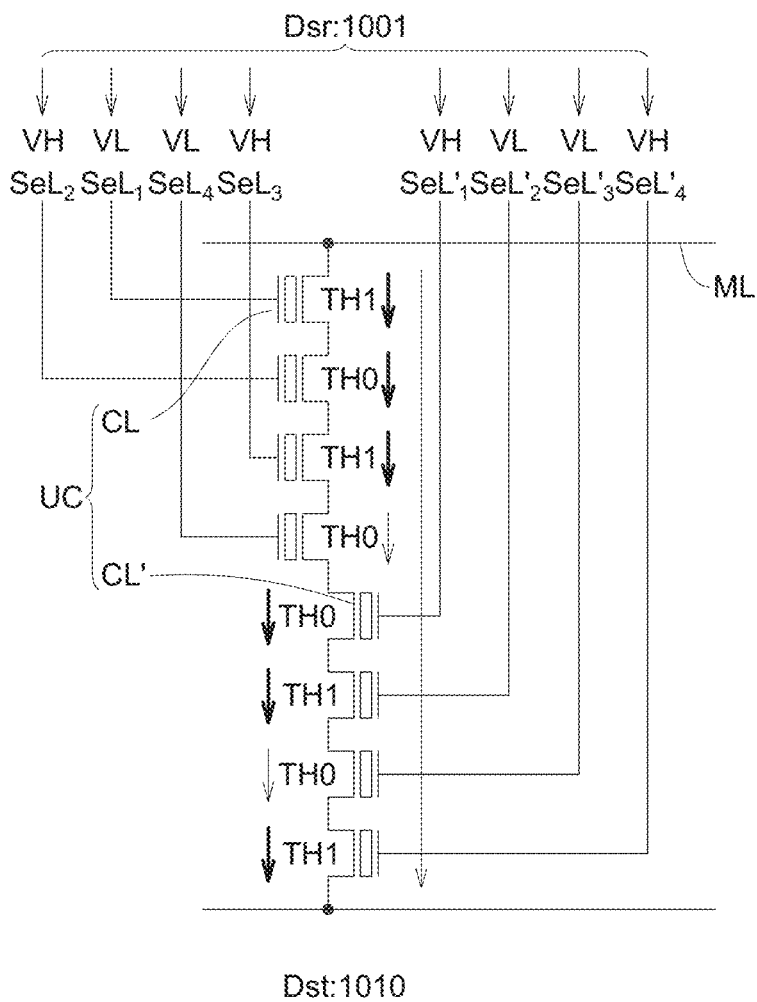
FIG. 9B illustrates one example of the operation method of a CAM.

Please refer to FIG. 9B, which illustrates one example of the operation method of a CAM 600B. When the existing data Dst is "1010", "the low threshold voltage TH1, T the high threshold voltage H0", "the high threshold voltage TH0, the low threshold voltage TH1", "the low threshold voltage TH1, the high threshold voltage TH0", "the high threshold voltage TH0, the low threshold voltage TH1" are respectively existing in four unit cells UC. When the search data Dsr is "1001", "the low input voltage VL, the high input voltage VH", "the high input voltage VH, the low input voltage VL", "the high input voltage VH, the low input voltage VL", "the low input voltage VL, the high input voltage VH" are respectively applied to the input lines $SeL_1$ and $SeL'_1$, $SeL_2$ and $SeL'_2$, $SeL_3$ and $SeL'_3$, and $SeL_4$ and $SeL'_4$. According to the table IV, the existing data Dst which is "1010" and the search data Dsr which is "1001" are matched at two of the bits, so the potential of the match line ML will be slightly dropped. As shown in FIGS. 9A and 9B, the more the current on the CAM string ST is, the better the match level is.

In a reverse mode operation, the existing data Dst and the search data Dsr may be defined by another way. For example, referring to table V, "the high threshold voltage TH0, the low threshold voltage TH1" set in the CAM cells CL, CL' represents "1" for the existing data Dst; "the low threshold voltage TH1, the high threshold voltage TH0" set in the CAM cells CL, CL' represents "0" for the existing data Dst; "the high threshold voltage TH0, the high threshold voltage TH0" set in the CAM cells CL, CL' represents "X" for the existing data Dst. "X" means "don't care." "the low threshold voltage TH1, the low threshold voltage TH1" set in the CAM cells CL, CL' represents "–" for the existing data Dst. "–" means "invalid."

TABLE V

| existing data Dst | CAM cells CL, CL' |
|---|---|
| 1 | TH0 TH1 |
| 0 | TH1 TH0 |
| X(Don't Care) | TH0 TH0 |
| —(Invalid) | TH1 TH1 |

In the reverse mode operation, referring to table VI, "the low input voltage VL, the high input voltage VH" applied to the input lines SeL, SeL' represents "1" for the search data Dsr; "the high input voltage VH, the low input voltage VL" applied to the input lines SeL, SeL' represents "0" for the search data Dsr; "the low input voltage VL, the low input voltage VL" applied to the input lines SeL, SeL' represents "X" for the search data Dsr. "X" means "wildcard."

TABLE VI

| search data Dsr | 1 | 0 | X(wildcard) |
|---|---|---|---|
| input lines SeL, SeL' | VL VH | VH VL | VL VL |

Figure 10:
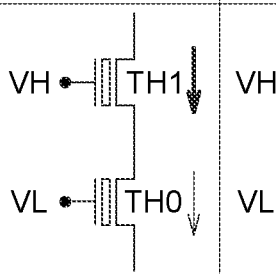
FIG. 10 shows the relationship between the existing data and the search data according to the reverse mode operation.

Please refer to FIG. 10 and table VII. FIG. 10 shows the relationship between the existing data Dst and the search data Dsr according to the reverse mode operation. If the search data Dsr is "0" and the existing data Dst is "0", the high input voltage VH and the low input voltage VL applied to the input lines SeL, SeL' will respectively turn on the CAM cells CL, CL' set by the low threshold voltage TH1 and the high threshold voltage TH0 with high gate overdrive and low gate overdrive, so the potential of the match line ML will be slightly dropped. If the search data Dsr is "0" and the existing data Dst is "1", the high input voltage VH and the low input voltage VL applied to the input lines SeL, SeL' will respectively turn on the CAM cells CL, CL' set by the high threshold voltage TH0 and the low threshold voltage TH1 with high gate overdrive both, so the potential of the match line ML will be greatly dropped. If the search data Dsr is "0" and the existing data Dst is "X", the high input voltage VH and the low input voltage VL applied to the input lines SeL, SeL' will respectively turn on the CAM cells CL, CL' set by the high threshold voltage TH0 and the high threshold voltage TH0 with high gate overdrive and low gate overdrive, so the potential of the match line ML will be slightly dropped. If the search data Dsr is "0" and the existing data Dst is "–" (invalid), the high input voltage VH and the low input voltage VL applied to the input lines SeL, SeL' will respectively turn on the CAM cells CL, CL' set by the low threshold voltage TH1 and the low threshold voltage TH1 with high gate overdrive both, so the potential of the match line ML will be greatly dropped.

If the search data Dsr is "1" and the existing data Dst is "0", the low input voltage VL and the high input voltage VH applied to the input lines SeL, SeL' will respectively turn on the CAM cells CL, CL' set by the low threshold voltage TH1 and the high threshold voltage TH0 with high gate overdrive both, so the potential of the match line ML will be greatly dropped. If the search data Dsr is "1" and the existing data Dst is "1", the low input voltage VL and the high input voltage VH applied to the input lines SeL, SeL' will respectively turn on the CAM cells CL, CL' set by the high threshold voltage TH0 and the low threshold voltage TH1 with low gate overdrive and high gate overdrive, so the potential of the match line ML will be greatly dropped. If the search data Dsr is "1" and the existing data Dst is "X", the low input voltage VL and the high input voltage VH applied to the input lines SeL, SeL' will respectively turn on the CAM cells CL, CL' set by the high threshold voltage TH0 and the high threshold voltage TH0 with low gate overdrive and high gate overdrive, so the potential of the match line ML will be slightly dropped. If the search data Dsr is "1" and the existing data Dst is "–" (invalid), the low input voltage VL and the high input voltage VH applied to the input lines SeL, SeL' will respectively turn on the CAM cells CL, CL' set by the low threshold voltage TH1 and the low threshold voltage TH1 with high gate overdrive both, so the potential of the match line ML will be greatly dropped.

If the search data Dsr is "X" and the existing data Dst is "0", the low input voltage VL and the low input voltage VL applied to the input lines SeL, SeL' will respectively turn on the CAM cells CL, CL' set by the low threshold voltage TH1 and the high threshold voltage TH0 with high gate overdrive and low gate overdrive, so the potential of the match line ML will be greatly dropped. If the search data Dsr is "X" and the existing data Dst is "1", the low input voltage VL and the low input voltage VL applied to the input lines SeL, SeL' will respectively turn on the CAM cells CL, CL' set by the high threshold voltage TH0 and the low threshold voltage TH1 with low gate overdrive and high gate overdrive, so the potential of the match line ML will be slightly dropped. If the search data Dsr is "X" and the existing data Dst is "X", the low input voltage VL and the low input voltage VL applied to the input lines SeL, SeL' will respectively turn on the CAM cells CL, CL' set by the high threshold voltage TH0 and the high threshold voltage TH0 with low gate overdrive both, so the potential of the match line ML will be slightly dropped. If the search data Dsr is "X" and the existing data Dst is "–" (invalid), the low input voltage VL and the low input voltage VL applied to the input lines SeL, SeL' will respectively turn on the CAM cells CL, CL' set by the low threshold voltage TH1 and the low threshold voltage TH1 with high gate overdrive both, so the potential of the match line ML will be greatly dropped.

Figure 11A:
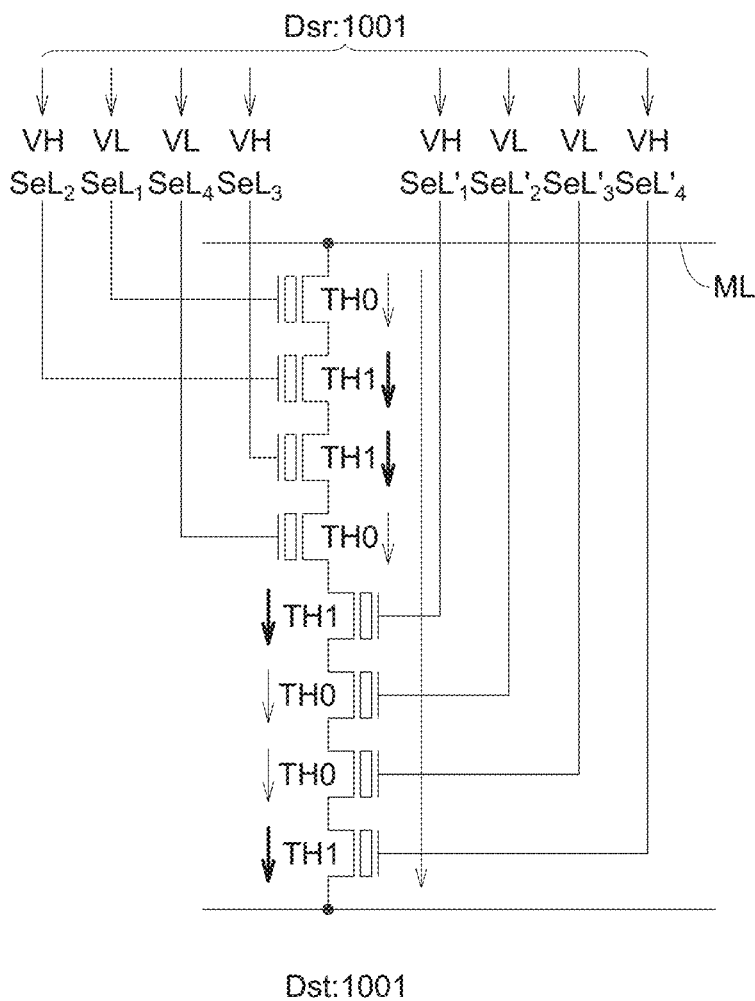
FIG. 11A illustrates one example of the operation method of a CAM.

Please refer to FIG. 11A, which illustrates one example of the operation method of a CAM 700A. When the existing data Dst is "1001", "the high threshold voltage TH0, the low threshold voltage TH1", "the low threshold voltage TH1, the high threshold voltage TH0", "the low threshold voltage TH1, the high threshold voltage TH0", "the high threshold voltage TH0, the low threshold voltage TH1" are respectively existing in the unit cells UC. When the search data Dsr is "1001", "the low input voltage VL, the high input voltage VH", "the high input voltage VH, the low input voltage VL", "the high input voltage VH, the low input voltage VL", "the low input voltage VL, the high input voltage VH" are respectively applied to the input lines $SeL_1$ and $SeL'_1$, $SeL_2$ and $SeL'_2$, $SeL_3$ and $SeL'_3$, and $SeL_4$ and $SeL'_4$. According to the table VII, the existing data Dst which is "1001" and the search data Dsr which is "1001" are matched at all of the bits, so the potential of the match line ML will be slightly dropped.

Figure 11B:
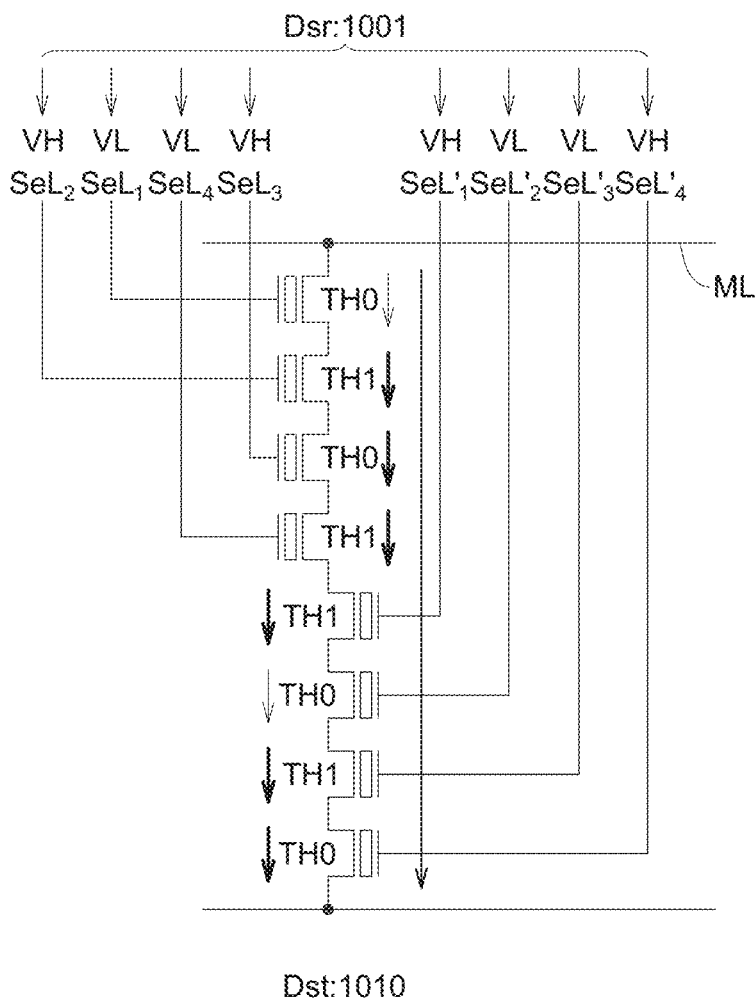
FIG. 11B illustrates one example of the operation method of a CAM.

Please refer to FIG. 11B, which illustrates one example of the operation method of a CAM 700B. When the existing data Dst is "1010", "the high threshold voltage TH0, the low threshold voltage TH1", "the low threshold voltage TH1, the high threshold voltage TH0", "the high threshold voltage TH0, the low threshold voltage TH1", "the low threshold voltage TH1, the high threshold voltage TH0" are respectively existing in the unit cells UC. When the search data Dsr is "1001", "the low input voltage VL, the high input voltage VH", "the high input voltage VH, the low input voltage VL", "the high input voltage VH, the low input voltage VL", "the low input voltage VL, the high input voltage VH" are respectively applied to the input lines $SeL_1$ and $SeL'_1$, $SeL_2$ and $SeL'_2$, $SeL_3$ and $SeL'_3$, and $SeL_4$ and $SeL'_4$. According to the table VII, the existing data Dst which is "1010" and the search data Dsr which is "1001" are matched at two of the bits, so the potential of the match line ML will be greatly dropped.

Figure 11C:
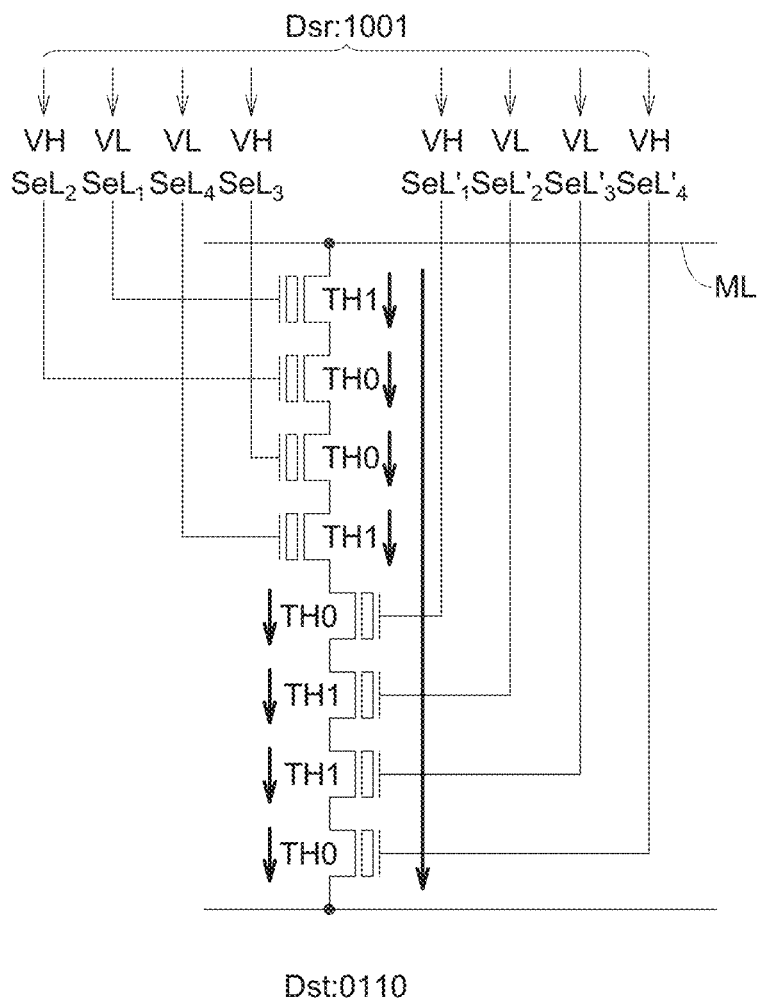
FIG. 11C illustrates one example of the operation method of a CAM.

Please refer to FIG. 11C, which illustrates one example of the operation method of a CAM 700C. When the existing data Dst is "0110", "the low threshold voltage TH1, the high threshold voltage TH0", "the high threshold voltage TH0, the low threshold voltage TH1", "the high threshold voltage TH0, the low threshold voltage TH1", "the low threshold voltage TH1, the high threshold voltage TH0" are respectively existing in the unit cells UC. When the search data Dsr is "1001", "the low input voltage VL, the high input voltage VH", "the high input voltage VH, the low input voltage VL", "the high input voltage VH, the low input voltage VL", "the low input voltage VL, the high input voltage VH" are respectively applied to the input lines $SeL_1$ and $SeL'_1$, $SeL_2$ and $SeL'_2$, $SeL_3$ and $SeL'_3$, and $SeL_4$ and $SeL'_4$. According to the table VII, the existing data Dst which is "0110" and the search data Dsr which is "1001" are not matched at any of the bits, so the potential of the match line ML will be

TABLE VII

| | | Existing data Dst | | | |
|---|---|---|---|---|---|
| | | 0 (TH1 TH0) | 1 (TH0 TH1) | X (TH0 TH0) | — (TH1 TH1) |
| Search data Dsr | 0 (VH VL) | Low current | High current | Low current | High current |
| | 1 (VL VH) | High current | Low current | Low current | High current |
| | X (VL VL) | Low current | Low current | Low current | High current | much greatly dropped. As shown in FIGS. 11A to 11C, the less the current of the CAM string ST is, the better the match level is.

Please refer to FIG. 12A, which illustrates the operation of several CAM strings ST according to one embodiment. One search data Dsr can be inputted to the CAM strings ST one by one. For example, as shown in FIG. 12A, one short search word, such as "1001", is compared with different existing words, such as "1001", "1011", ..., "1111", one by one.

Figure 12B:
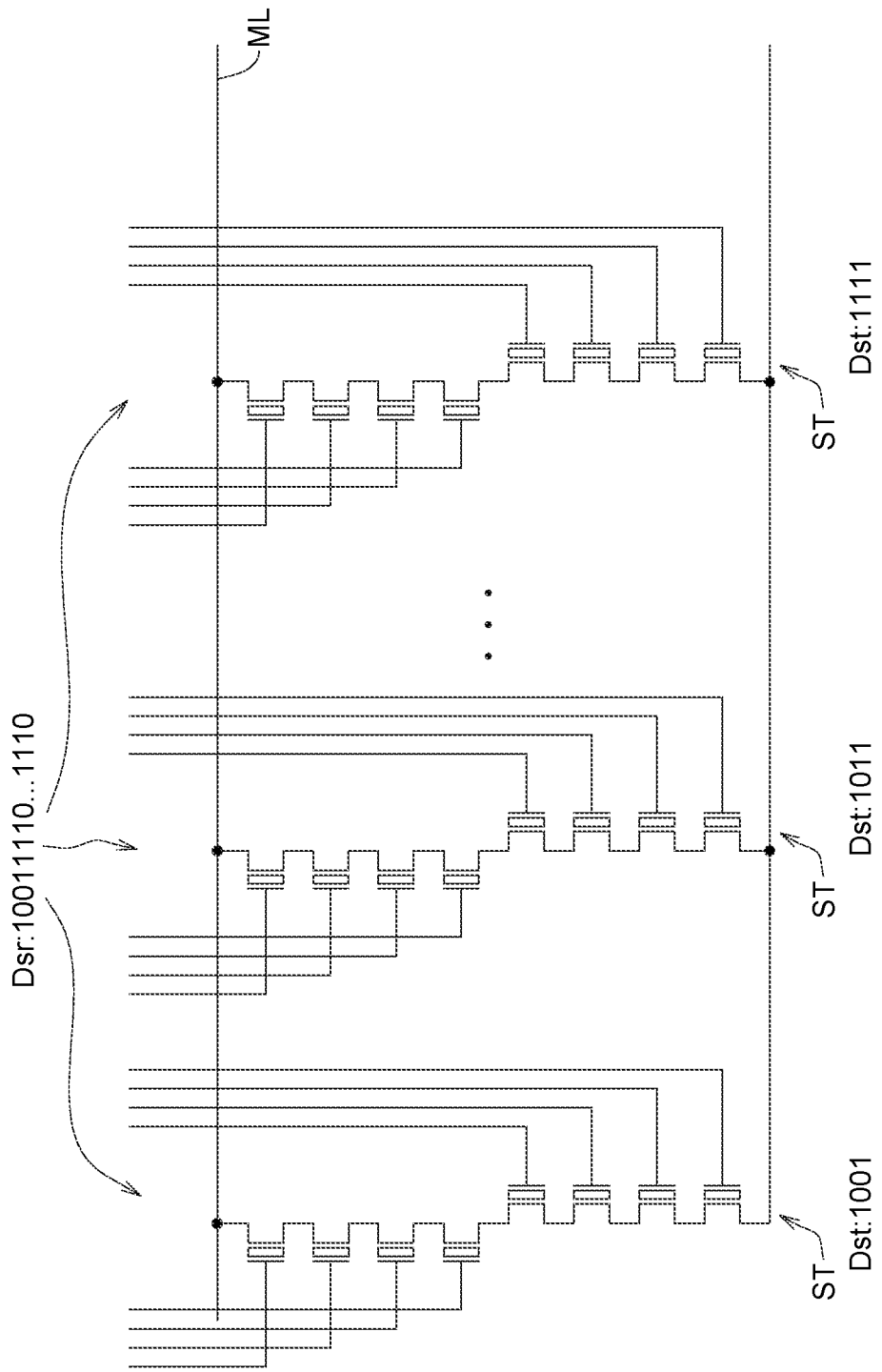
FIG. 12B illustrates the operation of several CAM strings according to another embodiment.

Please refer to FIG. 12B, which illustrates the operation of several CAM strings ST according to another embodiment. More than one search data Dsr can be inputted to the CAM strings ST simultaneously. For example, as shown in FIG. 12B, the long search word, such as "1001 1110 ... 1110", is split into several sub-words and those sub-words are compared with the existing words, such as "1001", "1011", ..., "1111", simultaneously.

Figure 13A:
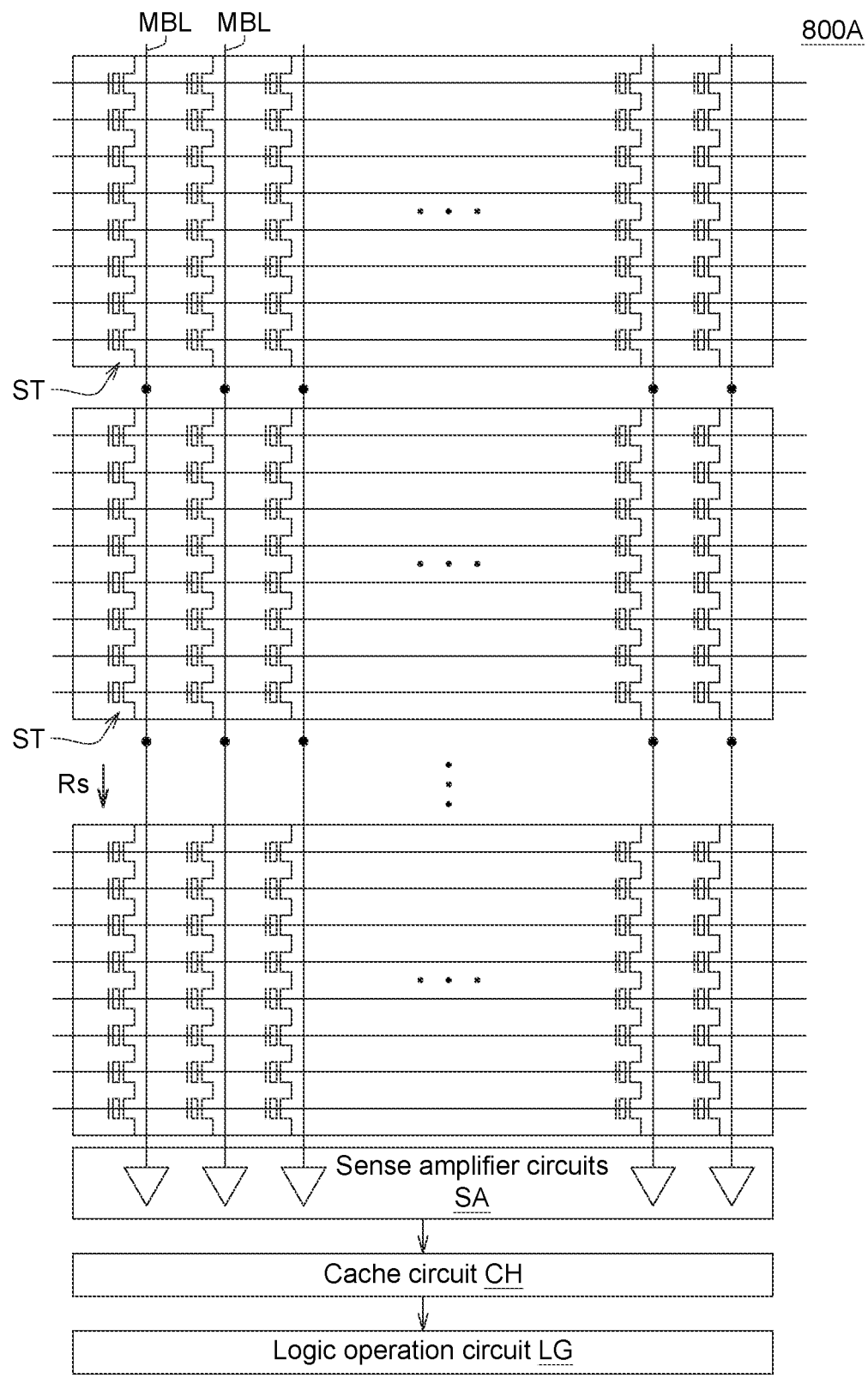
FIG. 13A illustrates a circuit architecture of a CAM according to one embodiment.

Please refer to FIG. 13A, which illustrates a circuit architecture of a CAM 800A according to one embodiment. The CAM 800A includes a plurality of CAM strings ST, a plurality of master bit lines MBL, a sense amplifier circuit SA, a cache circuit CH and a logic operation circuit LG. Each of the master bit lines MBL connects some of the CAM strings ST in series. The sense amplifier circuit SA is connected to the master bit lines MBL. The cache circuit CH is connected to the sense amplifier circuit SA. The logic operation circuit LG is connected to the cache circuit CH for performing the OR operation. The string matching results Rs are sequentially existing in the cache circuit CH, and then the logic operation circuit LG integrates the string matching results Rs existing in the cache circuit CH via the OR operation.

Figure 13B:
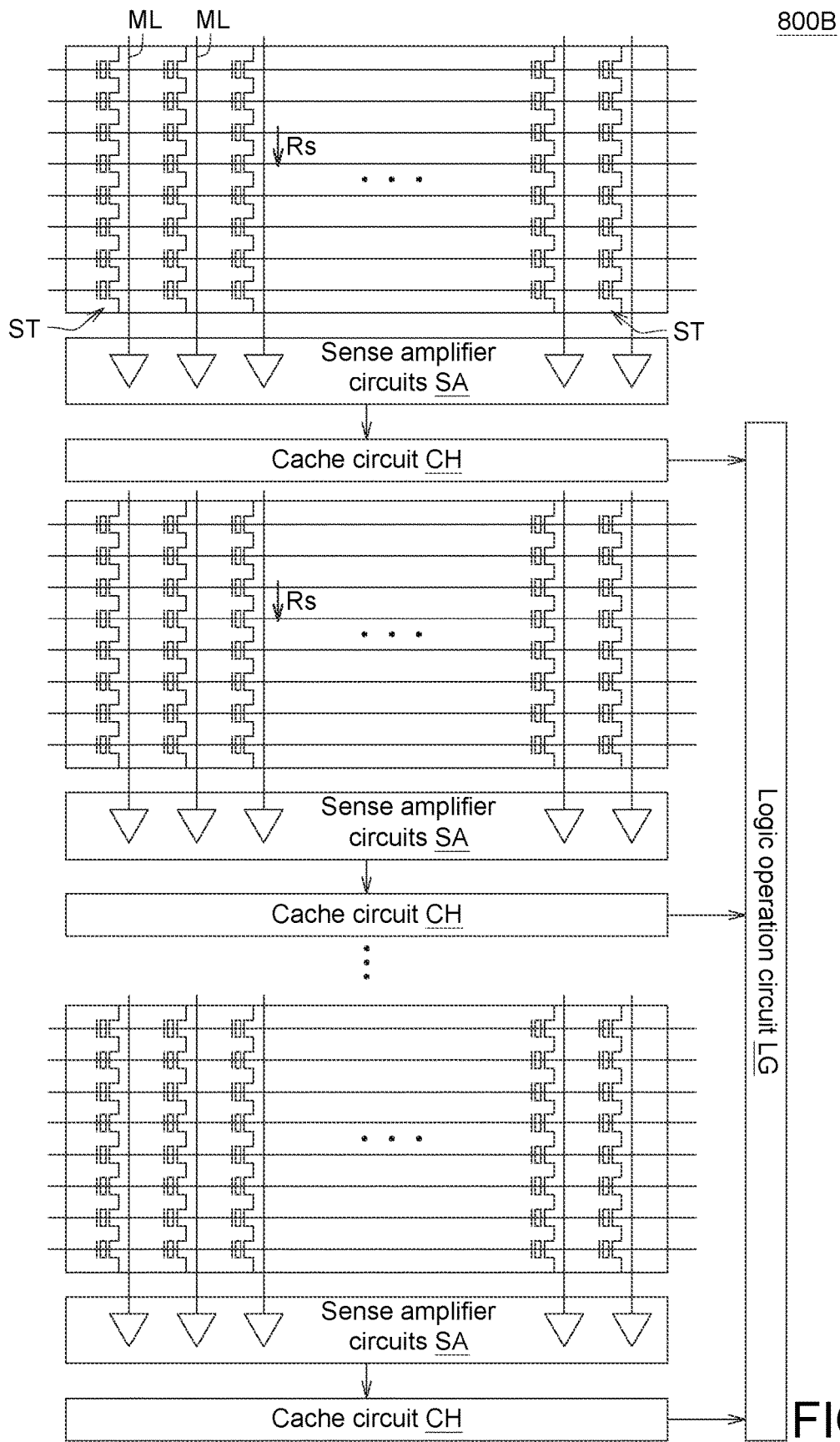
FIG. 13B illustrates a circuit architecture of a CAM according to one embodiment.

Please refer to FIG. 13B, which illustrates a circuit architecture of a CAM 800B according to one embodiment. The CAM 800B includes a plurality of CAM strings ST, a plurality of match lines ML, a plurality of sense amplifier circuit SA, a plurality of cache circuit CH and a logic operation circuit LG. Each of the match lines ML connects some of the CAM strings ST. Each of the sense amplifier circuits SA is connected to one of the match lines ML. Each of the cache circuit CH connects one of the sense amplifier circuits SA. The logic operation circuit LG is connected to the cache circuit for performing the OR operation. The string matching results Rs are simultaneously existing in the cache circuits CH, and then the logic operation circuit LG integrates the string matching results Rs existing in the cache circuits CH via the OR operation.

According to the embodiments described above, a hybrid type CAM with NAND architecture and NOR architecture is provided. The hybrid CAM has the advantages of both of the NOR-type CAM and the NAND-type CAM, as such both of the searching speed and the power consumption are improved.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A content addressable memory (CAM) for implementing in-memory-search, comprising:
    a plurality of CAM strings, each of which includes a plurality of CAM cells, wherein the CAM cells store a plurality of existing data; and
    at least one sense amplifier circuit, connected to the CAM strings, wherein a plurality of search data are inputted to the CAM strings, a plurality of cell matching results obtained from the CAM cells in each of the CAM strings are integrated via an AND operation to obtain a string matching result, and the string matching results obtained from the CAM strings are integrated via an OR operation,
    wherein each of the search data is set via a high input voltage or a low input voltage, each of the CAM cells is set via a high threshold voltage or a low threshold voltage, and the low input voltage is higher than the high threshold voltage.

2. The content addressable memory according to claim 1, wherein two of the CAM cells which are adjacent form a unit cell for storing one bit of the existing data.

3. The content addressable memory according to claim 1, wherein two of the CAM cells which are not adjacent form a unit cell for storing one bit of the existing data.

4. The content addressable memory according to claim 1, wherein two of the CAM cells which are located at two of the CAM strings form a unit cell for storing one bit of the existing data.

5. The content addressable memory according to claim 1, wherein two of the CAM cells which are located at two of the CAM strings which are adjacent form a unit cell for storing one bit of the existing data.

6. The content addressable memory according to claim 1, further comprising:
    a plurality of match lines, wherein a quantity of the at least one sense amplifier circuit is plural, each of the match lines is connected to some of the CAM strings, and each of the sense amplifier circuits is connected to one of the match lines.

7. The content addressable memory according to claim 1, wherein the search data are inputted to the CAM strings one by one.

8. The content addressable memory according to claim 1, wherein the search data are inputted to the CAM strings simultaneously.

9. The content addressable memory according to claim 1, further comprising:
    a plurality of master bit lines, each of which connects some of the CAM strings in series, wherein the at least one sense amplifier circuit is connected to each of the master bit lines;
    a cache circuit, connected to a respective one of the at least one sense amplifier circuit; and
    a logic operation circuit, connected to the cache circuit for performing the OR operation.

10. The content addressable memory according to claim 1, further comprising:
    a plurality of match lines, each of which is connected to some of the plurality of CAM strings, wherein a quantity of the at least one sense amplifier circuit is plural, each of the sense amplifier circuits is connected to one of the match lines;
    a plurality of cache circuits, each of which is connected to a respective one of the sense amplifier circuits; and
    a logic operation circuit, connected to each of the plurality of cache circuits for performing the OR operation.

11. An operation method of a content addressable memory (CAM) for implementing in-memory-search, comprising:
    inputting a plurality of search data to a plurality of CAM strings each of which includes a plurality of CAM cells, wherein the CAM cells store a plurality of existing data;

integrating a plurality of cell matching results obtained from the CAM cells in each of the CAM strings via an AND operation to obtain a string matching result; and integrating the string matching results obtained from the CAM strings via an OR operation, wherein each of the search data is set via a high input voltage or a low input voltage, each of the CAM cells is set via a high threshold voltage or a low threshold voltage, and the low input voltage is higher than the high threshold voltage.

12. The operation method of the content addressable memory according to claim 11, wherein in one of the CAM strings, the CAM cells are connected in series, thereby the cell matching results are integrated via the AND operation; and the CAM strings are connected to one of a plurality of match lines, thereby the string matching results are integrated via the OR operation.

13. The operation method of the content addressable memory according to claim 11, wherein the search data are inputted to the CAM strings one by one.

14. The operation method of the content addressable memory according to claim 11, wherein the search data are inputted to the CAM strings simultaneously.

15. The operation method of the content addressable memory according to claim 11, wherein the string matching results are sequentially existing in a cache circuit, and then the string matching results existing in the cache circuit are integrated via the OR operation.

16. The operation method of the content addressable memory according to claim 11, wherein the string matching results are simultaneously existing in a plurality of cache circuits, and then the string matching results existing in the cache circuits are integrated via the OR operation.

* * * * *